United States Patent
Cook

(10) Patent No.: US 8,432,219 B1
(45) Date of Patent: Apr. 30, 2013

(54) AMPLITUDE CONTROL SYSTEM AND METHOD FOR COMMUNICATION SYSTEMS

(75) Inventor: Benjamin W. Cook, San Francisco, CA (US)

(73) Assignee: Passif Semiconductor Corp., San Mateo, CA (US)

( * ) Notice: Subject to any disclaimer, the term of this patent is extended or adjusted under 35 U.S.C. 154(b) by 31 days.

(21) Appl. No.: 13/267,491

(22) Filed: Oct. 6, 2011

Related U.S. Application Data

(60) Provisional application No. 61/390,792, filed on Oct. 7, 2010.

(51) Int. Cl.
*H04B 1/10* (2006.01)
*H03G 11/00* (2006.01)

(52) U.S. Cl.
USPC .......................................... 330/135; 455/308

(58) Field of Classification Search .................. 455/308, 455/355, 341, 127.3, 194.2, 253.2, 293; 330/135, 330/96, 98
See application file for complete search history.

(56) References Cited

U.S. PATENT DOCUMENTS

| | | | | |
|---|---|---|---|---|
| 6,710,662 B2* | 3/2004 | Wang | ............................. | 330/295 |
| 7,170,359 B2* | 1/2007 | Koerner | ........................ | 331/183 |
| 7,352,247 B2* | 4/2008 | Oh et al. | ....................... | 330/311 |
| 7,619,470 B2* | 11/2009 | Abe et al. | ...................... | 330/251 |
| 7,974,580 B2* | 7/2011 | Fagg | ............................... | 455/42 |

\* cited by examiner

*Primary Examiner* — Sonny Trinh
(74) *Attorney, Agent, or Firm* — Gary Stanford

(57) ABSTRACT

An amplitude control system including one or more multi-element array power amplifiers (MEA-PA), each MEA-PA including multiple amplifiers, multiple capacitors, and multiple enable circuits. Each amplifier has an input coupled to a common input node and an output coupled to a corresponding one of multiple intermediate nodes. Each capacitor has a first end coupled to an output node and a second end coupled to a corresponding intermediate node. The enable circuits are collectively controlled by an amplitude control value, and each is operative to enable or disable a corresponding amplifier. The enable circuits may be dynamically controlled to modulate amplitude. A coupling circuit may be provided to couple an intermediate node to a reference node when a corresponding amplifier is disabled to adjust a coupling ratio. Each amplifier, when enabled, may receive one of multiple supply reference voltages. The capacitors may have equal capacitance or may be binary-weighted.

20 Claims, 13 Drawing Sheets

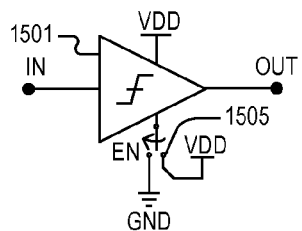
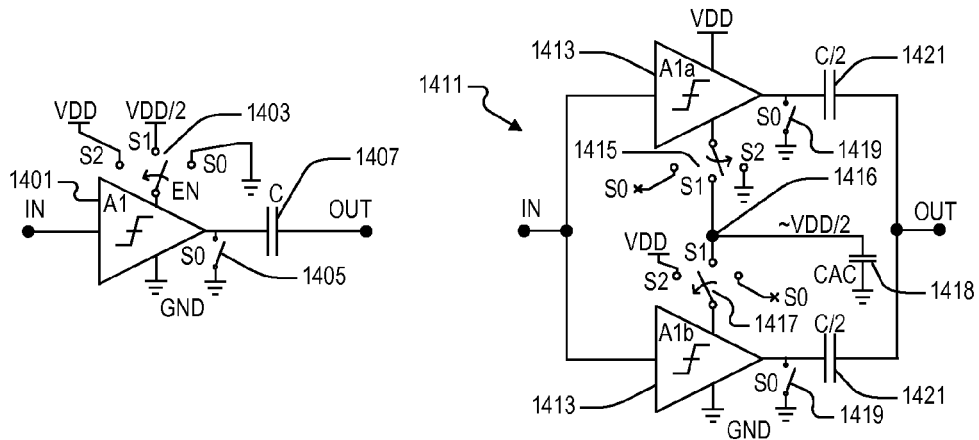
FIG. 14
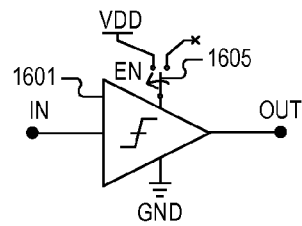
FIG. 15         FIG. 16
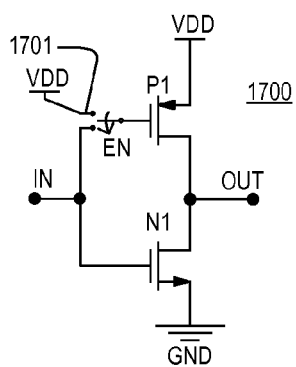    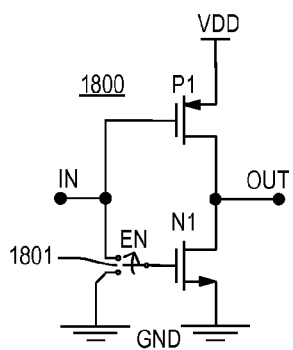    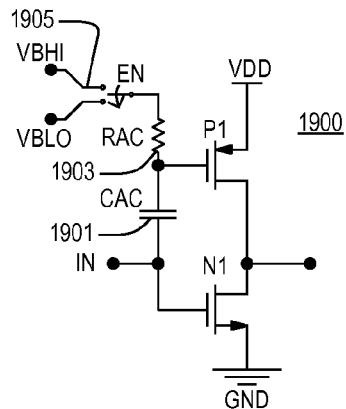
FIG. 17         FIG. 18         FIG. 19

AMPLITUDE CONTROL SYSTEM AND METHOD FOR COMMUNICATION SYSTEMS

CROSS-REFERENCE TO RELATED APPLICATIONS

This application claims the benefit of U.S. Provisional Application Ser. No. 61/390,792, filed on Oct. 7, 2010 which is herein incorporated by reference in its entirety for all intents and purposes.

BACKGROUND OF THE INVENTION

1. Field of the Invention

The present invention relates generally to amplitude control in communication systems, and more specifically, to a modulation system and method to improve the overall efficiency when controlling amplitude of RF signals having a non-constant envelope.

2. Description of the Related Art

Radio Frequency (RF) signals having a non-constant envelope (NCE) are common in several widely deployed wireless and wired or coaxial cable protocols such as 802.11/WiFi, Bluetooth EDR (Enhanced Data Rate), 3GPP-LTE ($3^{rd}$ Generation Partnership Protocol—Long Term Evolution), WCDMA (Wideband Code Division Multiple Access), HSDPA/HSUPA (High Speed Downlink Packet Access/High Speed Uplink Packet Access), WiMAX (Worldwide Interoperability for Microwave Access), HomePlug (various power line communications specifications that support networking over existing home electrical wiring), DOCSIS (Data Over Cable Service Interface Specification), among many others.

Modern communications standards often rely on NCE modulation schemes because they can achieve high-spectral efficiency, allowing more data throughput for a given bandwidth. As communications applications have grown more pervasive, communications standards have evolved to incorporate modulation schemes with higher bandwidth and more complexity, such as, for example, 64-QAM (Quadrature Amplitude Modulation) OFDM (Orthogonal Frequency-Division Multiplexing) in 802.11n (amendment to the IEEE 802.11-2007 wireless networking standard by the Institute of Electrical and Electronics Engineers). These modulation schemes facilitate high spectral efficiency and high maximum data transmission rates.

The conventional RF transmitter architectures and circuit techniques, however, have not achieved high efficiency when transmitting high bandwidth NCE signals. In particular, achieving high average PA (Power Amplifier) efficiency generally becomes more difficult as the Peak to Average Power Ratio (PAPR) of the transmitted signal increases, especially at high bandwidth. Low transmitter efficiency is a significant problem in portable wireless devices in which battery lifetime is especially important. Efficiency tradeoffs are often made for some of the most common transmitter topologies in use today, such as, for example, the conventional linear transmitter and the polar transmitter with supply-modulation.

An exemplary conventional linear transmitter sums orthogonal quadrature RF signals (e.g., $I_{RF}$ and $Q_{RF}$) at an input to a variable gain amplifier (VGA) having its output coupled to the input of a PA. The sum of $I_{RF}$ and $Q_{RF}$ provides a summation signal which carries substantially all of the information. The summation signal, however, typically does not have sufficient power for direct transmission. The VGA and PA are provided to amplify the summation signal without introducing excessive distortion and to drive an output load, such as an antenna or the like.

The PA and VGA should maintain a high degree of linearity to avoid distorting the output signal, hence the term "linear transmitter." The linearity requirement is at the heart of the efficiency limitation imposed by this architecture. The PA in a linear transmitter is traditionally a Class A or Class AB topology because of their ability to maintain a linear transfer characteristic. The Class A amplifier has a well known maximum efficiency of 50% for a full-scale output. The efficiency of the Class A amplifier, however, falls very quickly as the output signal amplitude drops below full-scale. Furthermore, the transfer characteristic of the Class A amplifier becomes nonlinear as the signal amplitude approaches full-scale. Thus, the linear transmitter designer seeks to ensure that the input to the PA avoids full-scale, which is exactly where the PA achieves its best efficiency.

The nonlinearity of an open loop Class A power amplifier may be roughly quantified by a 1 decibel (dB) compression point $P_{1dB}$. For a typical OFDM signal in 802.11g/n, the average PA input power should roughly be 10 dB below the compression point $P_{1dB}$ for a traditional Class A design, or in other words, an Output Power Backoff (OBO) of 10 dB. More recently, a variety of PA linearization and pre-distortion techniques are known that can improve the average PA efficiency by allowing for a lower OBO. The techniques essentially use feedforward and/or feedback compensation to correct for the nonlinearity of the PA transfer characteristic. While higher efficiencies are possible with the linear topology, it is fundamentally poorly suited to high-efficiency transmission of signals with large PAPR. This follows from the fact that linear PA efficiency is a super-linear function of output amplitude, resulting in extremely low efficiency at low output levels.

The efficiency limitations of linear transmitters for high PAPR signals are well known and thus several alternate, higher efficiency topologies have been proposed. The polar transmitter is one well-known topology that can theoretically transmit high PAPR signals with very high efficiency. In a polar transmitter, the RF signal is represented by its polar coordinates (i.e. amplitude and phase) rather than by Cartesian coordinates, as in the linear transmitter.

Essentially, the PA takes only one of the two polar coordinates, namely phase, at its RF input. The amplitude coordinate is controlled separately, typically by modulating the supply of a Class E, Class C or other high-efficiency PA, as these nonlinear power amplifiers respond linearly (to first order) to voltage supply variation. In terms of average efficiency, the key benefit of supply modulation is that it theoretically enables nearly constant PA efficiency versus output amplitude. There are, however, several practical challenges associated with simultaneously achieving high-efficiency, high-bandwidth, and high modulation accuracy that have made this approach impractical for many applications.

First, the amplitude response of the Class E power amplifier (and others) is not perfectly linear with supply voltage and the output phase is not constant. Further, zero output amplitude is difficult to achieve via supply modulation with this topology. These non-idealities can result in high EVM (error vector magnitude) and distortion products that degrade spectral purity. The nonlinearity of the amplitude and phase responses can be compensated digitally, but circuit-level modifications and/or dynamic reduction of the amplitude envelope of the RF input signal are required in order to reach zero output amplitude. Furthermore, the additional power consumption associated with implementing accurate digital pre-distortion can outweigh the proposed efficiency benefits of the architecture.

In contrast to the linear transmitter, the PA in the polar transmitter need not reproduce amplitude variations at its RF input linearly, and thus may operate in its deeply nonlinear, higher efficiency region, regardless of amplitude. Overall efficiency, however, is determined by the product of PA efficiency and the efficiency of the amplitude modulation (AM) circuitry. Thus, the burden of high efficiency is split between PA and the AM circuitry, and the efficiency of the amplitude modulator is critical.

High overall efficiency may be achievable by using an inductor-based switching DC-DC converter, such as a buck converter, to control the PA supply. However, in practice, this is very difficult to achieve for all but the lowest bandwidth applications. A major drawback of this approach is the bandwidth limitation imposed by the buck converter, as this implies a very high switching frequency for the converter. As modulation bandwidth, and thus switching frequency, of the DC-DC converter is increased, the efficiency of the converter degrades rapidly.

In addition, the modulation bandwidth of a switching converter is dependent on its output level, with the lowest bandwidth regions at the upper and lower extremes of the output range. This bandwidth dependence results in AM loop dynamics that vary as a function of output amplitude, which presents a serious challenge for meeting EVM and spectral mask requirements, especially as bandwidth and PAPR increase.

In light of the challenges, hybrid supply control strategies have been proposed in which a combination of a low dropout (LDO) regulator and a switching converter are used to control the PA supply. If the desired signal modulation bandwidth is far in excess of the bandwidth of the switching converter, then the overall efficiency of the system is sharply degraded. Further, hybrid methods present a difficult control problem due to the use of two separate amplitude modulator circuits. These methods generally tradeoff efficiency to achieve higher bandwidth.

What is needed is a method for achieving high bandwidth amplitude modulation that maintains high efficiency and stable dynamics across a wide range of amplitude values, thereby enabling a high efficiency transmitter that addresses the needs of high bandwidth, high PAPR signal constellations which are prevalent in modern spectrally efficient communication systems.

BRIEF DESCRIPTION OF THE DRAWINGS

The benefits, features, and advantages of the present invention will become better understood with regard to the following description, and accompanying drawings where:

FIG. 14 is a schematic diagram of two functionally equivalent unit amplifiers and illustrating the stacking of individual amplifiers to emulate multiple non-zero voltage supply inputs;

FIG. 15 is a schematic diagram of a unit amplifier illustrating enabling/disabling via the lower supply terminal;

FIG. 16 is a schematic diagram illustrating disabling a unit amplifier with an open-circuit connection;

FIG. 17 is a schematic diagram illustrating disabling a limiting amplifier without using switches in series with the supply terminals;

FIG. 18 is another schematic diagram illustrating disabling a limiting amplifier without using switches in series with the supply terminals;

FIG. 19 is another schematic diagram illustrating disabling a limiting amplifier without using switches in series with the supply terminals;

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

An amplitude control system and method for communication systems according to various embodiments of the present invention avoids the requirement of high bandwidth PA supply modulators to achieve amplitude modulation. In one embodiment, multiple DC supply voltages are used to achieve high efficiency. The DC voltages may be static and may further be well-defined. The DC voltages may already be available within a given system, or they may be efficiently generated by any number of DC-DC conversion methods. The system and method described herein may utilize the linear input/output amplitude response of a constant-swing RF input voltage source when capacitively coupled to a resistive or resonant load, in which the output amplitude is a linear function of the ratio of coupling capacitance between source and load to the total capacitance.

Figure 1:
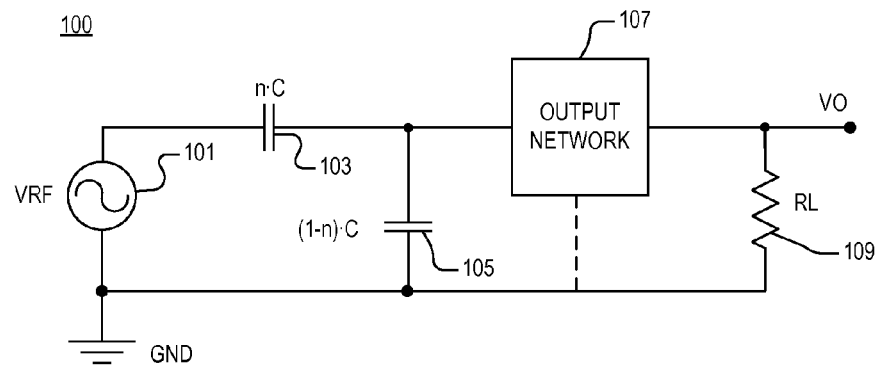
FIG. 1 is a simplified schematic and block diagram of an amplitude control system implemented according to an embodiment of the present invention illustrating the concept of linear amplitude control via capacitive coupling.

FIG. 1 is a simplified schematic and block diagram of an amplitude control system 100 implemented according to an embodiment of the present invention illustrating a basic concept of linear amplitude control via capacitive coupling. An input RF voltage VRF relative to a reference node and developed by an RF source 101 is provided to one end of a variable or adjustable capacitance 103. In the illustrated embodiments, the reference node is ground (GND) although alternative voltage levels are contemplated. A common ground symbol is used throughout the drawings to reference ground or any other suitable reference voltage level. Different ground types are contemplated, such as power ground, signal ground, etc. The other end of the capacitance 103 is coupled to one end of another variable or adjustable capacitance 105 and to an input of a output network 107. The other end of the capacitance 105 is coupled to ground, and the output of the output network 107 is coupled to an output node developing an output voltage VO. A load 109 is provided between the output node and ground. In the simplified illustration, the load 109 is shown as a load resistor having a resistance RL (e.g., 50Ω). The output network 107 may be referenced to ground, as shown by a dashed line.

In one embodiment, VRF is a constant amplitude RF sine wave. The capacitance 103 is shown having a capacitance value of n·C in which "n" is a coupling ratio and C is a predetermined nominal capacitance value. The capacitance 105 is shown having a capacitance value of (1−n)·C. The output network 107 may be implemented as a shunt inductor or the like (e.g., 807, FIG. 8) with an inductance L, although the output network 107 may be implemented as a network with a wide variety of resistive, capacitive and/or inductance values. The amplitude of the output voltage VO is a linear function of the coupling ratio n.

Figure 2:
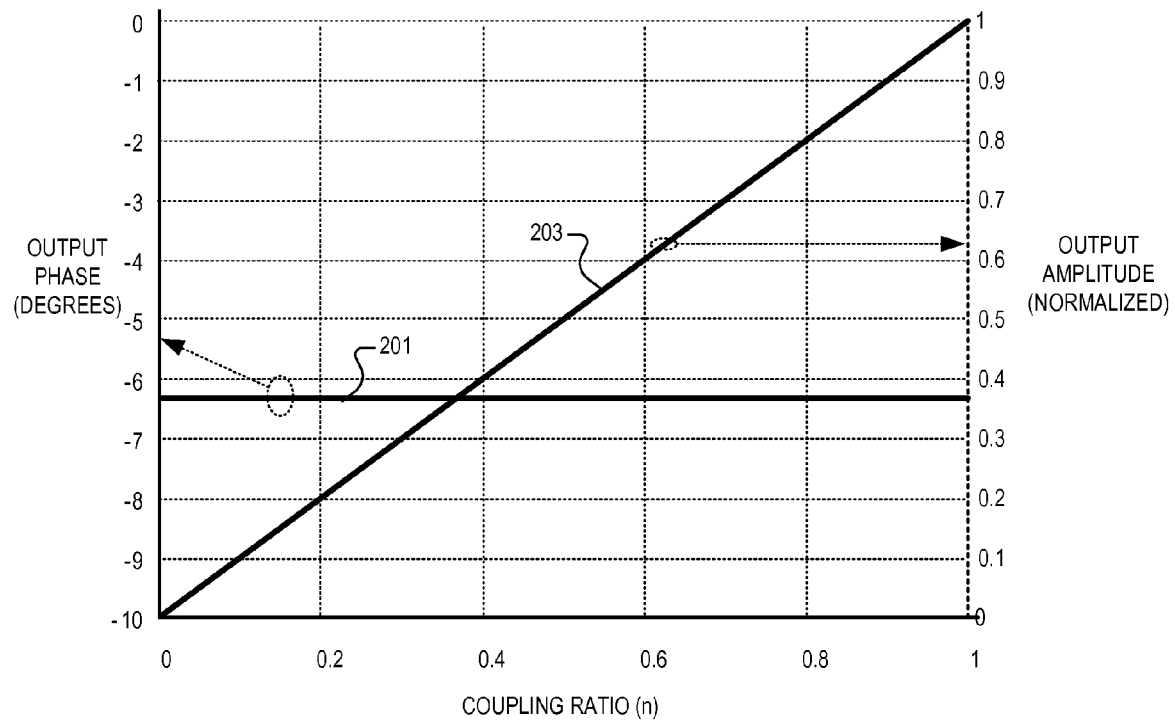
FIG. 2 is a graph diagram plotting simulated output phase in degrees and normalized amplitude of the output voltage versus the coupling ratio of the network of FIG. 1.

FIG. 2 is a graph diagram plotting simulated output phase in degrees (curve 201, left-side vertical scale) and normalized amplitude of the output voltage VO (curve 203, right-side vertical scale) versus the coupling ratio n of the amplitude control system 100, in which the coupling ratio ranges from 0 to 1. Ideally, the output phase remains constant with variations of the coupling ratio as shown. Ideally, the output amplitude changes linearly with variations of the coupling ratio as shown. Conceptually, the coupling ratio is varied in a continuous manner with corresponding continuous changes of the capacitances 103 and 105 for continuous amplitude modulation. Practical circuit configurations employ discrete capacitive adjustments to adjust the coupling ratio in a discrete manner as further described herein.

Figure 3:
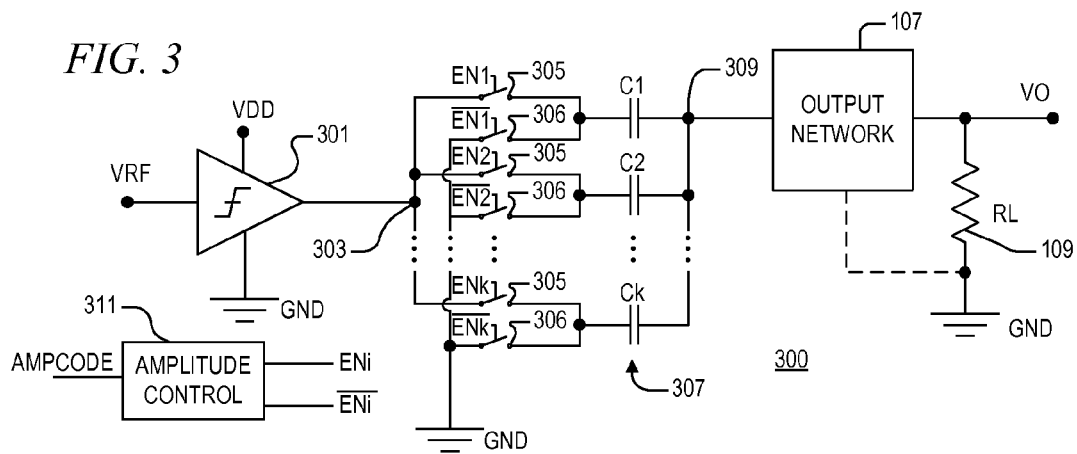
FIG. 3 is a schematic and block diagram of an amplitude control system implemented according to a more specific embodiment of the amplitude control system of FIG. 1 using switched capacitors to vary the coupling ratio n.

FIG. 3 is a schematic and block diagram of an amplitude control system 300 implemented according to a more specific embodiment of the amplitude control system 100 using switched capacitors to vary the coupling ratio n. VRF is provided to the input of a power amplifier (PA) or unit amplifier 301, which has an upper supply terminal receiving a source voltage VDD and a lower supply terminal coupled to ground. The output of the unit amplifier 301 is coupled to a common input node 303, which is coupled to one end of each of a set of "k" first single-pole, single-throw (SPST) switches 305. The other end of each of the switches 305 is coupled to one end of a corresponding one of an array of k capacitors 307 (individually labeled C1, C1, . . . , Ck), each having another end coupled to a common node 309. Another set of k SPST switches 306 each have one end coupled to a corresponding one of the capacitors 307 and a second end coupled to ground. Node 309 is coupled to the input of the output network 107, having an output coupled to the output node developing VO. The load 109 is coupled between VO and ground in similar manner as previously described for the amplitude control system 100. The output network 107 may be coupled to ground as illustrated by a dashed line link to ground.

Each of the capacitors 307 is a "unit" capacitor in which all have approximately the same capacitance. Each of the switches 305 is controlled by a corresponding one of k enable signals EN1, EN2, . . . , ENk (EN1-ENk), in which each switch is closed when the corresponding enable signal is asserted high and opened when the enable signal is asserted low. In a similar manner, each of the switches 306 is controlled by a corresponding one of k enable inverted signals $\overline{EN1}, \overline{EN2}, \ldots, \overline{ENk}$ ($\overline{EN1}$-$\overline{ENk}$), in which each switch is closed when the corresponding enable signal is asserted high and opened when the enable signal is asserted low. Each of the enable signals $\overline{EN1}$-$\overline{ENk}$ is an inverted version of a corresponding one of the enable signals EN1-ENk (e.g., $\overline{EN1}$ is low when EN1 is high, and vice-versa). In this manner, when an enable signal EN1-ENk is high, the corresponding capacitor C1-Ck is inserted between nodes 303 and 309, and when low, the corresponding capacitor C1-Ck is inserted between node 309 and ground. An amplitude controller 311 is provided which converts an amplitude code AMPCODE to the enable signals ENi (EN1-ENk) and $\overline{ENi}$ ($\overline{EN1}$-$\overline{ENk}$).

In operation of the amplitude control system 300, the coupling ratio is increased in discrete steps by sequentially setting the enable signals EN1-ENk high (and thus setting the corresponding inverted enable signals $\overline{EN1}$-$\overline{ENk}$ low). The amplitude controller 311 receives AMPCODE as a binary or digital value indicative of the desired amplitude, and provides the enable signals accordingly to selectively switch the capacitors 307. The amplitude control system 300 illustrates thermometer coding of the enable signals assuming that the unit capacitors C1-Ck each have an equal value of capacitance. In an alternative embodiment, a binary-weighted configuration may also be implemented, such as illustrated by the capacitor array 2407 of FIG. 24. For example, the capacitances are binarily distributed (C, 2·C, 4·C, etc.) and a binary code is provided to the switches to achieve a substantially similar result.

In comparison with the amplitude control system 100, the AMPCODE determines the coupling ratio to select any number of the capacitors 307 for contributing to the series capacitance 103, and to select the remaining number of the capacitors 307 for contributing to the capacitance 105 to collectively form an adjustable capacitive voltage divider.

In one embodiment, the unit amplifier 301 is a "limiting" amplifier, such as an inverter-based or push-pull amplifier or the like. A limiting amplifier has its output limited between minimum and maximum levels. Thus, the output of the limiting amplifier does not exceed the minimum and maximum levels even when a sufficiently large RF input signal VRF exceeds the minimum and/or maximum levels. Thus, it maintains a constant amplitude at the capacitor array input, regardless of the coupling ratio n. The amplitude control system 300 may be conveniently implemented in an integrated circuit (IC) process. The switches 305 and 306 may be implemented, for example, by complementary metal-oxide semiconductor (CMOS) transistors or the like. It is noted that any of the switches or switching functions described herein may be implemented in any suitable manner. For example, each switch may be implemented by any suitable combination of P-type or N-type transistors, such as field-effect transistors (FETs) including metal-oxide semiconductor (MOS) type FETs and the like. Alternative switching or select configurations are contemplated for implementing any switching function, such as a decoder or a multiplexer or the like. Thus, any switch function, such as a SPST, a single-pole, double-throw (SPDT) switch, or a multi-position switch are conceptually shown in the drawings to illustrate a corresponding switching function which may be physically implemented in any appropriate manner for performing enabling/disabling functions.

Figure 4:
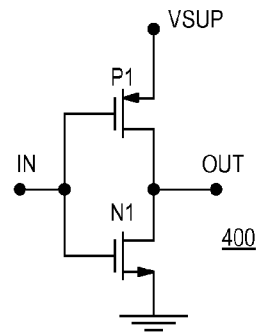
FIG. 4 is a schematic diagram of a limiting amplifier which may be used to implement the power amplifiers of FIG. 3 according to one embodiment.

FIG. 4 is a schematic diagram of a limiting amplifier 400, which may be used to implement the unit amplifier 301 according to one embodiment. In this case, the limiting amplifier 400 is configured as a relatively simple CMOS inverter. An input voltage IN is provided to the gates of a PMOS transistor P1 and an NMOS transistor N1. The source of P1 is coupled to receive a supply voltage VSUP and the source of N1 is coupled to ground, and the drains of P1 and N2 are coupled together at an output node developing an output voltage OUT. When used as the unit amplifier 301, IN is VRF, VSUP is VDD, and the output node is coupled to node 303. P1 and N1 are sized appropriately and driven with a sufficiently large RF input signal VRF to substantially ensure rail-to-rail output swing.

Figure 5:
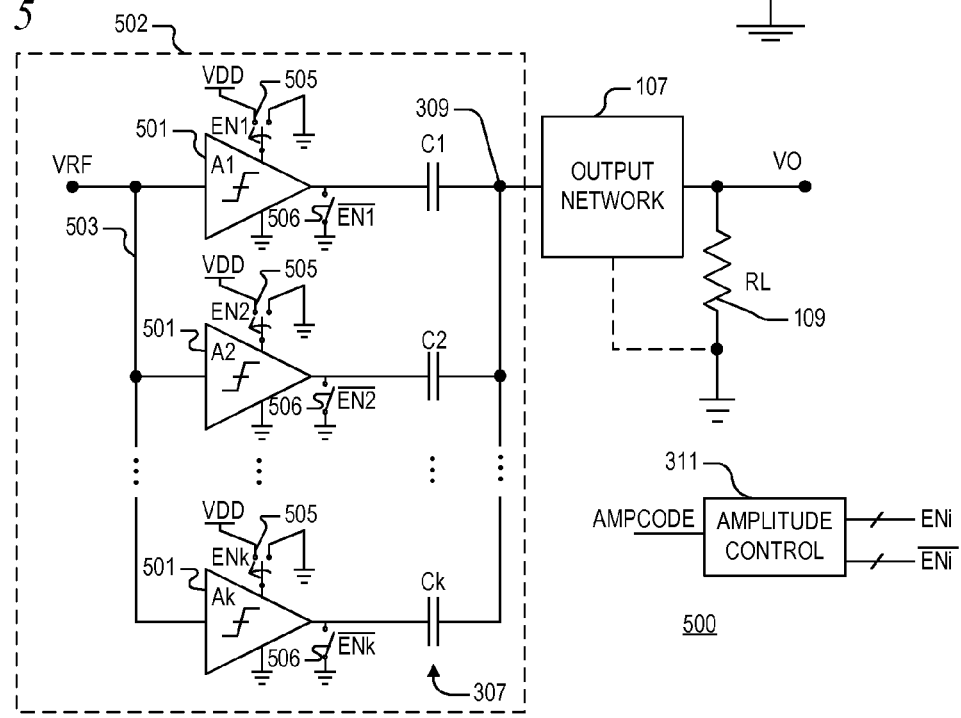
FIG. 5 is a schematic and block diagram of another amplitude control system implemented according to another embodiment in which the power amplifier is split into an array of sub-units forming a multi-element array power amplifier (MEA-PA)

FIG. 5 is a schematic and block diagram of another amplitude control system 500 implemented according to another embodiment in which the amplifier is split into an array of k sub-units. Each sub-unit includes a unit amplifier, one or more switches, and a corresponding capacitor. In this case, VRF is provided to a common input node 503, which is coupled to each input of an array of k unit amplifiers 501 (individually labeled A1, A2, . . . , Ak). Each unit amplifier 501 may be configured in a similar manner as the limiting amplifier 400. The output of each unit amplifier 501 is coupled to one end of a corresponding one of the array of capacitors 307 including the unit capacitors C1-Ck in a similar manner as for the amplitude control system 300. Node 309 is coupled to the input of the output network 107, having an output coupled to the output node developing VO provided across the load 109 in similar manner as previously described for the amplitude control systems 100 and 300.

In this case, each unit amplifier 501 has a pair of supply terminals, including a lower or reference terminal coupled to ground. In the illustrated embodiment, the upper terminal of each unit amplifier 501 is coupled to the common pole of a corresponding one of an array of k SPDT switches 505. Each of the switches 505 is controlled by a corresponding one of the enable signals EN1-ENk and switches the upper terminal of the corresponding unit amplifier 501 between ground and a supply voltage VDD. An array of SPST switches 506 are each shown coupled between an output of a corresponding one of the array of unit amplifiers 501 and ground, and each is controlled by a corresponding one of the inverted enable signals $\overline{EN1}$-$\overline{ENk}$. The amplitude controller 311 is provided and operates as previously described for converting the amplitude code AMPCODE to the enable signals ENi (EN1-ENk) and $\overline{ENi}$ ($\overline{EN1}$-$\overline{ENk}$).

When a corresponding enable signal ENi is low and the corresponding inverted enable signal $\overline{ENi}$ is high, the corresponding switch 505 disables the corresponding unit amplifier or unit amplifier 501 by coupling its upper supply terminal to ground, and by grounding the output of the unit amplifier. Thus, the corresponding terminal of the corresponding capacitor Ci is grounded as well, so that it is placed between node 309 and ground.

Operation of the amplitude control system 500 is similar to that of the amplitude control system 300, in which the coupling ratio is increased by discrete steps by sequentially setting the enable signals EN1-ENk high (and thus setting the corresponding inverted enable signals $\overline{EN1}$-$\overline{ENk}$ low). The amplitude controller 311 receives AMPCODE as a binary or digital value indicative of the desired amplitude, and provides the enable signals accordingly. If the unit capacitors C1-Ck each have an equal value of capacitance, then thermometer coding of the enable signals may be used. In an alternative embodiment, a binary-weighted configuration may also be implemented, as illustrated by the binary-weighted MEA-PA 2402 shown in FIG. 24.

At least one benefit of the amplitude control system 500 as compared with the amplitude control system 300 is that each unit amplifier 501 drives a fixed coupling capacitance when enabled. The unit amplifier 301 of the amplitude control system 300, on the other hand, drives a single capacitor up to k capacitors, which may cause unwanted variations in the output phase as amplitude is varied, as compared to the amplitude control system 500. Another benefit is that the amplitude control system 500 avoids the use of series switches in the RF signal path (e.g., switches 305). Additionally, the sub-divided amplitude control system 500 uses two methods to vary the output amplitude, including a capacitive coupling ratio and a variable supply voltage to each unit amplifier.

The array of sub-units between nodes 503 and 309, including the unit amplifiers 501, the switches 505 and 506, and the capacitors 307, is collectively referred to herein as a multi-element array PA (MEA-PA) 502.

In some embodiments, a unit amplifier output need not have an explicit switch to an AC-ground when disabled. FIG. 15, for example, illustrates an alternative embodiment in which one or more of the unit amplifiers may be enabled/disabled by disconnecting its lower supply terminal instead, because in either case, current flow from a power supply is effectively disabled. As shown by unit amplifier 1501, the upper supply terminal of unit amplifier 1501 is coupled to VDD and its lower supply terminal is switched via switch 1503 between VDD (disabled) and ground (enabled) as controlled by enable signal EN. It is further noted that an amplifier may not require an explicit connection on both supply terminals when disabled, such as shown in FIG. 16. In this case, switch 1605 switches the upper supply terminal of unit amplifier 1601 between VDD (enabled) and an open-circuit (disabled). The open-circuit connection disables the amplifier by removing its power source preventing current flow.

Although the unit amplifiers 501 of the amplitude control system 500 are enabled/disabled with switches provided in series with their supply terminals, there are many other ways to enable/disable unit amplifiers and to achieve similar results. The illustrated switches are intended to clearly illustrate the concept of enabling/disabling unit amplifiers and to vary the output amplitude. In some embodiments, it may be desirable to avoid having switches in series with the upper or lower supply terminals of the unit amplifiers. As shown in FIG. 17, for example, a limiting amplifier 1700 is configured in substantially similar manner as the limiting amplifier 400 except including a switch 1701 positioned to switch the gate of P1 between the input IN (enabled) and VDD (disabled). When coupled to VDD, P1 is turned off (cutting off current from the upper supply terminal) effectively disabling the amplifier. When disabled, switch 1701 opens the path from the input to the gate of P1 and pulls the gate high to force P1 into the cut-off region such that it does not pull significant current from the input supply. When enabled, switch 1701 passes the input signal and bias voltage to the gate of P1. FIG. 18 illustrates another example in which a limiting amplifier 1800 is configured in substantially similar manner as the limiting amplifier 1700 except including a switch 1801 positioned to switch the gate of N1 between the input IN (enabled) and ground (disabled). The gate of N1 for the switch 1800 is controlled in substantially similar manner as the gate of P1 for the switch 1700.

FIG. 19 illustrates another method of enabling/disabling a unit amplifier 1900 that does not use any switches or switching function in series with the supply terminals of the amplifier. The unit amplifier 1900 includes P1 and N1 in similar manner as the unit amplifier 1700, and further includes an AC capacitor 1901 with capacitance CAC coupled between the gates of P1 and N1 and a resistor 1903 with resistance RAC coupled between the gate of P1 and a switch 1905. The switch 1905 switches between an upper voltage VBHI and a lower voltage VBLO. In this case, the input signal is AC-coupled to the gates of P1 and a DC bias voltage is provided to through resistor RAC. When switch 1905 selects VBHI, the gate of P1 is pulled sufficiently high to force P1 into the cut-off region despite the presence of an input signal, and the amplifier is effectively disabled. When switch 1905 selects VBLO, the DC bias is pulled to a lower voltage that allows P1 to enter an active region of operation and pull current from the input supply VDD.

Figure 6:
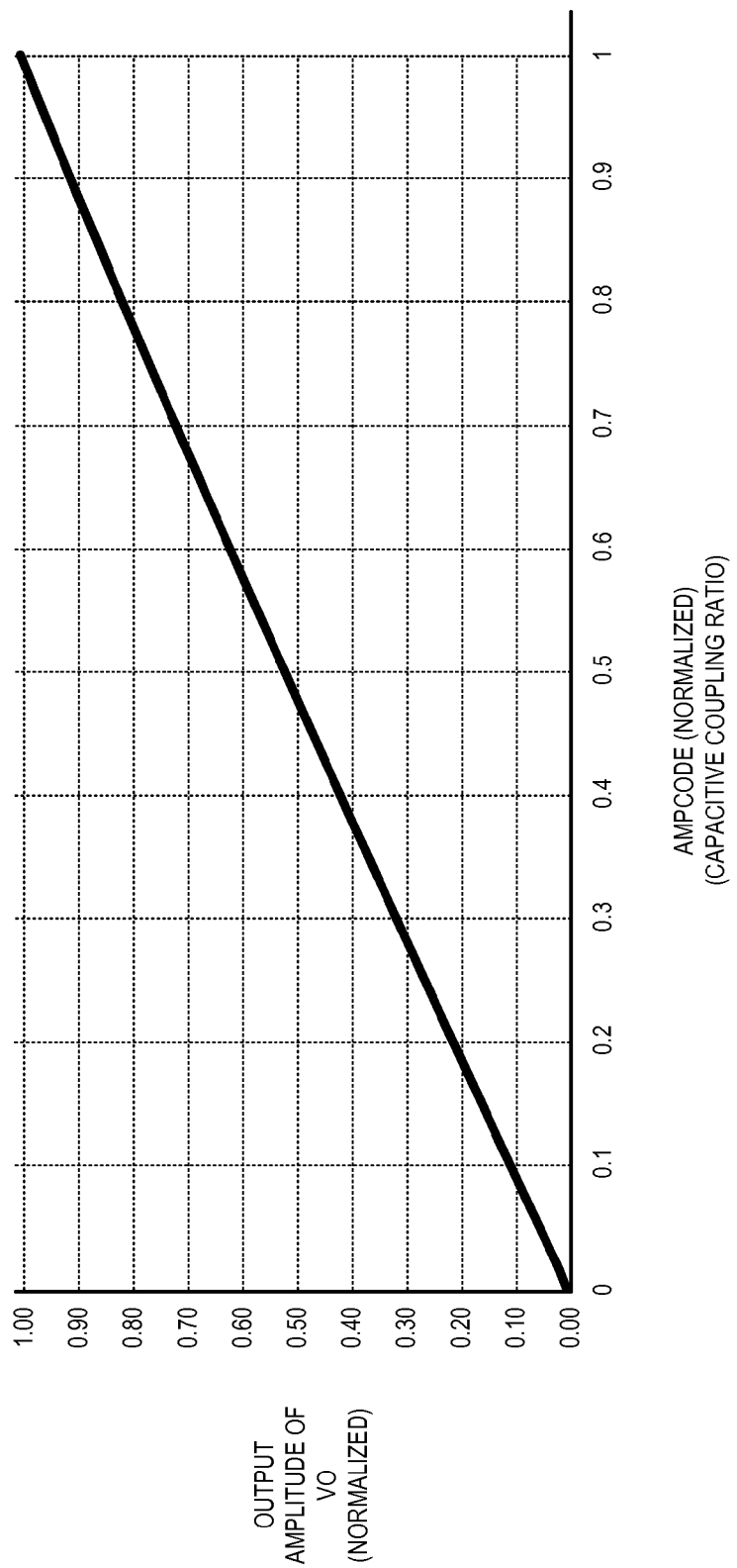
FIG. 6 is a graphic diagram plotting simulated normalized amplitude of the output of the amplitude control system of FIG. 5 versus normalized amplitude code.

FIG. 6 is a graphic diagram plotting simulated normalized amplitude of the output VO of the amplitude control system 500 versus normalized amplitude code (AMPCODE) representing the capacitive coupling ratio. The output network 107 is configured as a shunt inductor (e.g., 807). As illustrated in FIG. 6, the MEA-PA 502 of the amplitude control system 500 achieves a very linear response between AMPCODE and output amplitude of VO.

Figure 7:
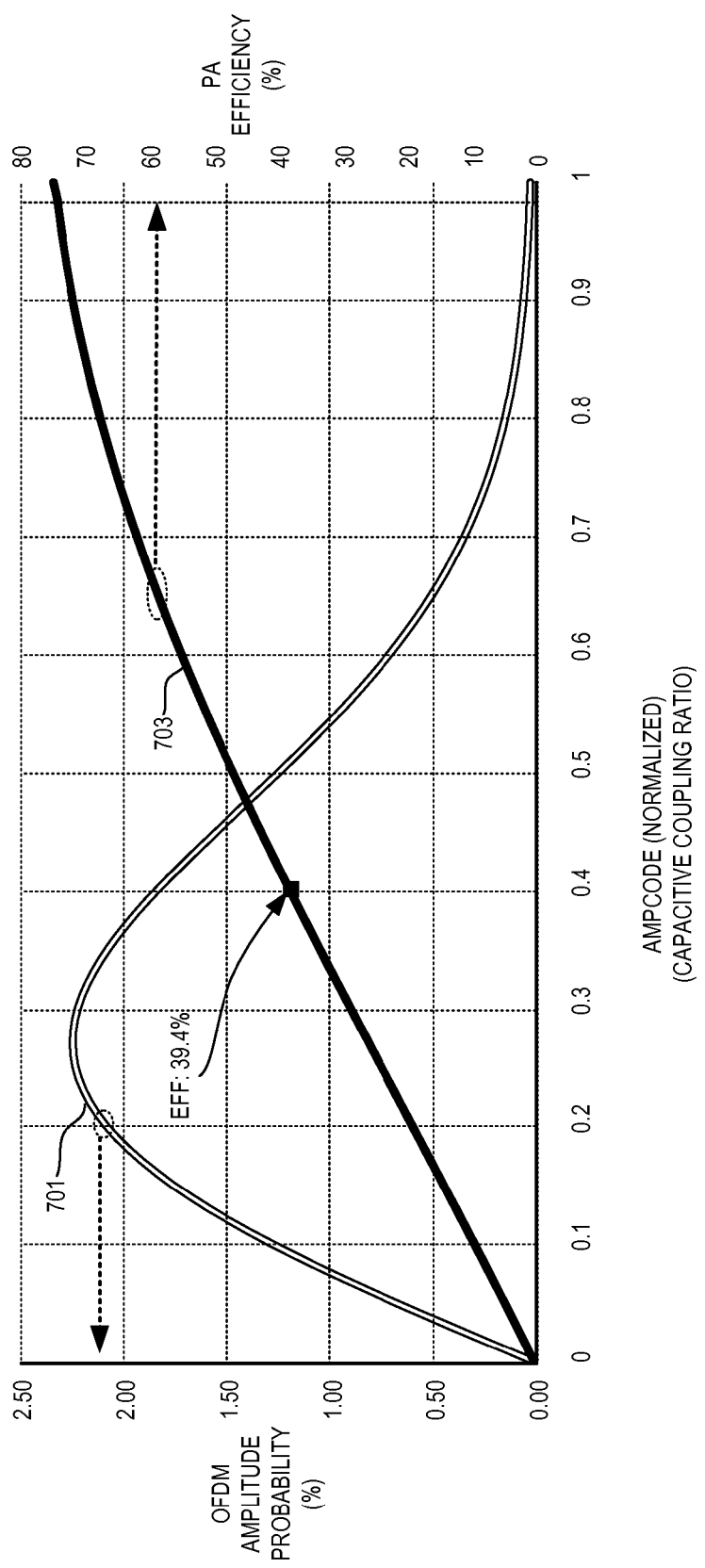
FIG. 7 is a graphic diagram plotting efficiency of the multi-element array power amplifier of FIG. 5 for a Wi-Fi OFDM type signal.

FIG. 7 is a graphic diagram plotting the amplitude probability of VRF as a Wi-Fi OFDM type signal (double-line curve 701, left-side vertical scale) and the corresponding efficiency of the MEA-PA 502 (curve 703, right-side vertical scale), both versus normalized AMPCODE. The DC bias point of VRF is VDD/2 for this simulation. Although the efficiency rises with amplitude, and the amplitude distribution is concentrated at the lower end of the coupling ratio scale, the average effective efficiency is about 40%. For Wi-Fi OFDM type signals, this represents a substantial improvement as compared to the efficiency of linear amplifiers used as PA structures, such as class AB with or without pre-distortion having an efficiency which may range from about 5% to about 12%.

As illustrated above, an MEA-PA structure with capacitive coupling, such as illustrated by the MEA-PA 502, achieves a highly linear response with respect to the input amplitude code (e.g., AMPCODE) and is capable of putting out near zero amplitude. The switch-enabled nature of the topology allows for very rapid transitions between output amplitudes, thereby making high bandwidth modulation possible. Further, efficiency is a sub-linear function of amplitude code, as compared to with the super-linear (i.e. amplitude-squared) characteristic of the linear unit amplifier, which results in much higher average efficiency for signals with large PAPR. In the above simulation, the output network was simply a shunt inductor (e.g., 807) chosen to resonate with the total capacitance of the unit amplifier array, though many other networks may be used that are well suited to the topology.

Figure 8:
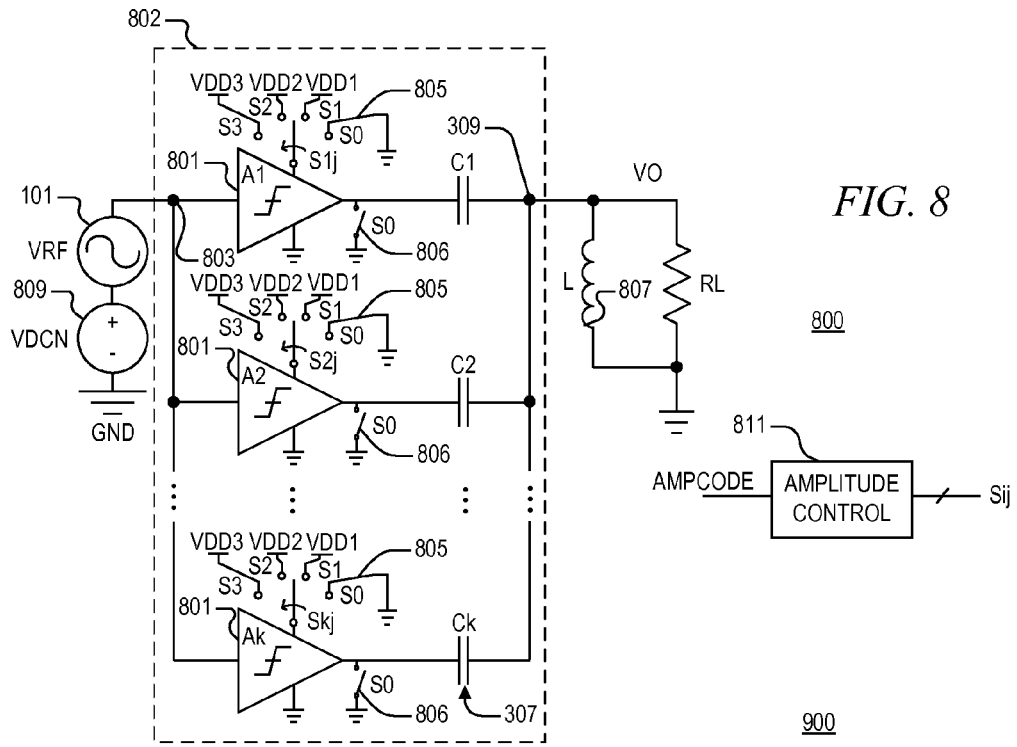
FIG. 8 is a schematic and block diagram of another amplitude control system including another multi-element array power amplifier configured to operate with multiple supply voltages.
Figure 10:
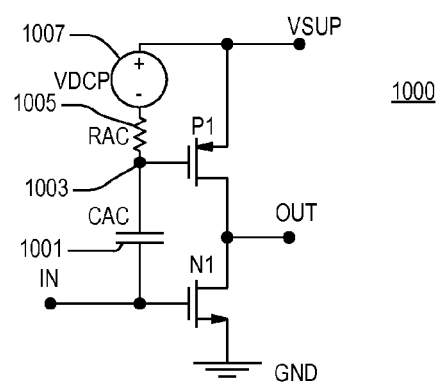
FIG. 10 is a schematic diagram of a power amplifier configured as a limiting amplifier, which may be used to implement any one or more of the power amplifiers of the multi-element array power amplifier of FIG. 8 according to one embodiment.

FIG. 8 is a schematic and block diagram of another amplitude control system 800 according to another embodiment, in which the amplitude control system 800 is similar to the amplitude control system 500 including an MEA-PA 802 configured to operate with multiple supply voltages. The MEA-PA 802 is split into an array of k sub-units, where each sub-unit includes a unit amplifier 801, multiple switches 805 and 806, and the array of k capacitors 307. A bias voltage source 809, further described below, provides a DC bias voltage VDCN and is coupled in series with the RF source 101 between a common input node 803 and ground. Node 803 is coupled to each input of an array of k unit amplifiers 801 (individually labeled A1, A2, . . . , Ak) within the MEA-PA 802. Although each unit amplifier 801 may be configured in a similar manner as the limiting amplifier 400, an additional configuration is shown in FIG. 10 (unit amplifier 1000). The output of each unit amplifier 801 is coupled to one end of a corresponding one of the array of capacitors 307 including the unit capacitors C1-Ck within the MEA-PA 802 in a similar manner as for the amplitude control systems 300 and 500. In this case, the output network is a shunt inductor 807 with inductance L coupled between node 309 and ground. Node 309 is the output node developing VO provided across the load 109 in similar manner as previously described.

The MEA-PA 802 is shown with an array of k multi-position switches 805 and a corresponding array of k SPST switches 806 to exemplify the enabling/disabling function. In a similar manner as previously described, each unit amplifier 801 has a pair of supply terminals, including a lower or reference terminal coupled to ground, and an upper terminal coupled to a common pole of a corresponding one of the switches 805. Each switch 805 has four positions defining four different states of the PA, namely S0, S1, S2 and S3. Each switch 805 is controlled by a corresponding one of multiple switch signals Sij in which "i" is a first index from 1 to k denoting the particular switch, and "j" is a second index from 0 to 3 denoting one of four different states S0-S3 of the "ith" switch. For example, the first switch is controlled by a signal S1j having four values S0, S1, S2 and S3 for selecting four supply voltage values for the upper terminal, including ground, VDD1, VDD1 and VDD3, respectively.

Each of the switches 806 is coupled between an output of a corresponding one of the array of unit amplifiers 801 and ground in a similar manner as the switches 501, except that each switch 806 is closed when the corresponding control signal Sij indicates S0, and is otherwise opened. For example, if the control signal S1j for the first switch 805 is S0 thus selecting the first position for ground, then the corresponding switch 806 is closed coupling the output of the first amplifier A1 to ground. If S1j selects any other position (e.g., S1, S2 or S3), then the corresponding switch 806 is opened.

In this manner, if the S0 state of a switch 805 is selected, then the corresponding unit amplifier 801 is disabled in which its supply voltage and output are both grounded. This effectively grounds one end of the corresponding capacitor so it is coupled between node 309 and ground. Otherwise, the unit amplifier 801 receives a selected one of supply voltages VDD1, VDD2, or VDD3 and its output is not grounded but otherwise drives the corresponding capacitor positioned in series between nodes 803 and 309. In sum, each sub-unit includes a unit amplifier 801, a corresponding switch pair 805 and 806, and a corresponding capacitor, and each sub-unit has one of four states S0-S3.

Figure 9:
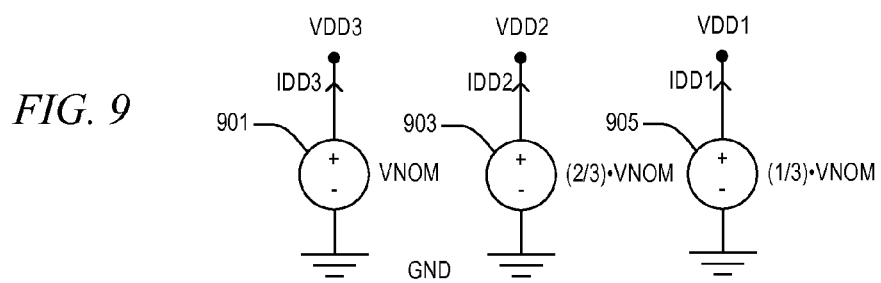
FIG. 9 is a schematic diagram of an exemplary power supply system for developing the voltage levels for the multi-element array power amplifier of FIG. 8.

FIG. 9 is a schematic diagram of an exemplary power supply system for developing the voltage levels of VDD1-VDD3. A first voltage source 901 develops VDD3 at a predetermined "nominal" voltage level VNOM relative to ground and provides a corresponding current level IDD3. VNOM is selected as any suitable voltage level for the particular implementation. A second voltage source 903 develops VDD2 relative to ground at a predetermined proportion of VNOM, such as (⅔)·VNOM, and provides a corresponding current level IDD2. A third voltage source 905 develops VDD1 relative to ground at a predetermined proportion of VNOM, such as (⅓)·VNOM, and provides a corresponding current level IDD1. In this case, the supply voltage levels are evenly distributed based on VNOM, namely, ground (or 0V), ⅓ VNOM, ⅔ VNOM, and VNOM.

FIG. 10 is a schematic diagram of a unit amplifier 1000 configured as a limiting amplifier, which may be used to implement any one or more of the unit amplifiers 801 according to one embodiment. In this case, the unit amplifier 1000 is configured as a relatively simple CMOS inverter with supply-referenced bias circuitry in order to compensate for variation in supply voltage. An input voltage IN is provided to the gate of an NMOS transistor N1 and to one end of an AC coupling capacitor 1001 having a capacitance CAC. The other end of capacitor 1001 is coupled to a node 1003, which is further coupled to the gate of a PMOS transistor P1 and to one end of a resistor 1005 having a resistance RAC. The other end of the resistor 1005 is coupled to the negative terminal of a bias voltage source 1007 developing a DC bias voltage VDCP, and the positive terminal of the bias voltage source 1007 is coupled to the supply voltage VSUP which is further coupled to the source of P1. The source of N1 is coupled to ground, and the drains of P1 and N2 are coupled together at an output node developing an output voltage OUT.

When used as the unit amplifier 801, IN is coupled to node 803, VSUP is coupled to the common pole of a corresponding one of the switches 805, and the output node is coupled to one end of a corresponding one of the capacitors C1-Ck. P1 and N1 are sized appropriately and driven with a sufficiently large RF input signal VRF to substantially ensure rail-to-rail output swing. Also, the bias voltage source 809 provides the voltage VDCN for each of the NMOS transistors N1 within the unit amplifiers 801, and each unit amplifier 801 includes the bias voltage source 1007 for providing the bias voltage VDCP for the corresponding PMOS transistor P1.

It is noted that although ideal voltage sources are shown in the simplified schematics, actual circuit implementations need not generate reference voltages below ground. A high-pass filter is formed by the components 1005 and 1001 (RAC and CAC) to couple the RF input signal VRF to the PMOS gate, while the DC bias VDCP for P1 is supplied through RAC. Many different unit-PA topologies and biasing arrangements are possible within the scope of the present invention, in which the inverter-based example of the limiting amplifiers (e.g., 400 and 1000) are used for the purpose of illustration.

The amplitude control system 800 with the MEA-PA 802 using intermediate supply voltages (e.g., VDD1-VDD3) and using the unit amplifier 1000 for each unit amplifier 801 provides significantly improved efficiency as compared to the amplitude control system 300 or the MEA-PA 502. In essence, the linear amplitude response of the MEA-PA 802 enables an effective interpolation of output amplitude in between discrete supply voltage values while maintaining high efficiency throughout the range. The MEA-PA 802 is an exemplary implementation with k sub-units each receiving four supply voltages (including ground), in which each PA sub-unit has one of four states S0-S3 determined by the positions of the switches 805 and 806 as controlled by the amplitude control signals Sij. Each unit amplifier 801 is disabled (supply and output grounded), or is coupled to a selected one of supply voltages VDD1-VDD3. In this manner, the amplitude control system 800 has $4^k$ different and unique states, although one or more of the states may be unused or unnecessary for a given implementation. Also, many of the "unique" combinations may be redundant.

Figure 20:
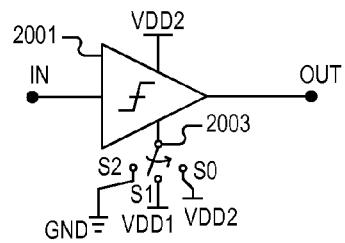
FIG. 20 is a schematic diagram of a unit amplifier with multiple supply voltages illustrating enabling/disabling via the lower supply terminal.

In a similar manner as previously illustrated by unit amplifier 1501, enabling and disabling of any one or more unit amplifiers within an MEA-PA having multiple supply voltages may be accomplished through the lower supply terminal as well as the upper supply terminal, as illustrated by unit amplifier 2001 shown in FIG. 20. The upper supply terminal is coupled to a supply voltage VDD2, and the lower supply terminal is coupled to a switch 2003 which switches between voltage levels VDD2, VDD1 and GND in corresponding states S0, S1 and S2. The unit amplifier 2001 is disabled in state S0 when its upper and lower supply terminals are coupled to a common voltage level VDD2. In state S1, the unit amplifier 2001 is enabled and both its upper and lower supply terminals are at a positive voltage relative to ground. The unit amplifier 2001 is also enable in state S2 with voltage VDD2 relative to ground.

Figure 21:
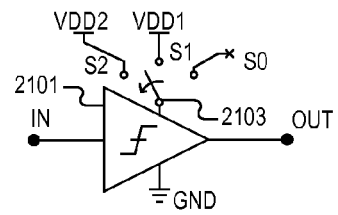
FIG. 21 is a schematic diagram illustrating disabling a unit amplifier with multiple supply voltages and using an open-circuit connection.

FIG. 21 shows a unit amplifier 2101 with its lower supply terminal coupled to ground and its upper terminal coupled to switch 2103 switching the unit amplifier 2101 between 3 states S0, S1 and S2. In states S1 and S2, the unit amplifier 2101 is enabled at supply voltage levels VDD1 and VDD2, respectively. The unit amplifier 2101 is disabled in state S0 when the switch 2103 open-circuits the upper supply terminal. As shown by unit amplifier 2101, when disabled in state S0, a unit amplifier may not require an explicit connection on both supply terminals.

Figure 22:
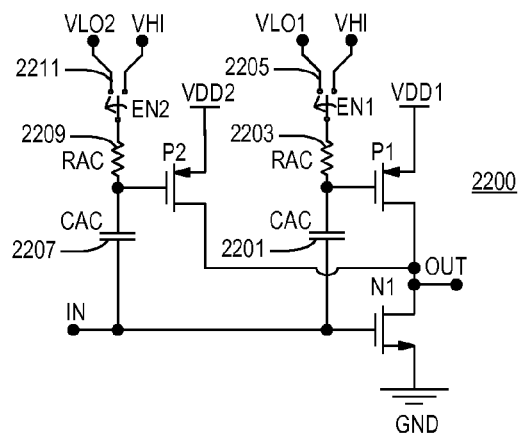
FIG. 22 is a schematic diagram illustrating enabling and disabling a unit amplifier with multiple supply voltages without using switches in series with the supply terminals.

Many methods may be used for enabling a unit amplifier with respect to each of its available supplies. Series supply switches may be used, as illustrated by unit amplifier 1000, but in some cases a series supply switch may not be desired. One alternate method for enabling/disabling a unit amplifier is illustrated by unit amplifier 2200 shown in FIG. 22. P1 and N1 are coupled in series in similar manner as the amplifier 400 between VDD1 and ground forming output node OUT at their common drain connection. The input IN is provided to the gate of N1. A capacitor 2201 (capacitance CAC) is coupled between IN and the gate of P1, and a resistor 2203 (resistance RAC) is coupled between the gate of P1 and a first switch 2205 which switches between voltage levels VHI and VLO1 in response to a first enable signal EN1. Another PMOS transistor P2 has its source coupled to supply voltage VDD2 and its drain coupled to the drains of P1 and N1 at the output node OUT. Another capacitor 2207 (capacitance CAC) is coupled between IN and the gate of P2, and another resistor 2209 (resistance RAC) is coupled between the gate of P2 and a second switch 2211 which switches between voltage levels VHI and VLO2 in response to a second enable signal EN2.

For the unit amplifier 2200, the input signal is AC-coupled to the gates of P1 and P2, in which P1 and P2 may be individually enabled or disabled based upon the position of the switches 2205 and 2211, respectively. The switches 2205 and 2211 adjust the DC bias voltage applied to the gates of P1 and P2, respectively, to put them in an active or cutoff region of operation. The unit amplifier 2200 is disabled when EN1 and EN2 both select VHI to put P1 and P2 in their respective cutoff regions. When EN1 selects VLO1 and EN2 selects VH1, P2 is in its cutoff region and disabled so that P1 and N1 are active based on voltage level VDD1. When EN1 selects VH1 and EN2 selects VLO2, P1 is in its cutoff region and disabled so that P2 and N1 are active based on voltage level VDD2.

Figure 23:
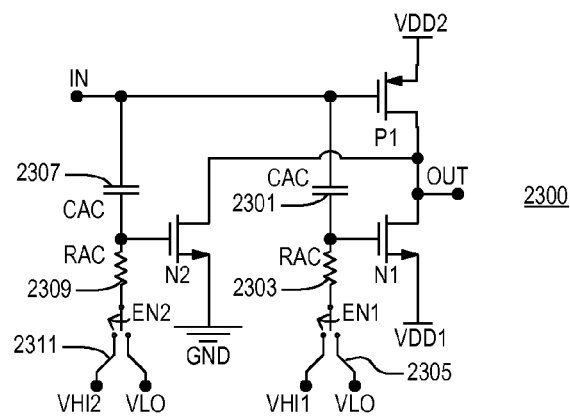
FIG. 23 is another schematic diagram illustrating enabling and disabling a unit amplifier with multiple supply voltages without using switches in series with the supply terminals.

FIG. 23 shows a similar unit amplifier 2300. In this case, P1 and N1 are coupled in series in similar manner as the amplifier 400 between VDD2 and ground forming output node OUT at their common drain connection. The input IN is provided to the gate of P1. A capacitor 2301 (capacitance CAC) is coupled between IN and the gate of N1, and a resistor 2303 (resistance RAC) is coupled between the gate of P1 and a first switch 2305 which switches between voltage levels VHI1 and VLO in response to a first enable signal EN1. Another NMOS transistor N2 has its source coupled to ground and its drain coupled to the drains of P1 and N1 at the output node OUT. Another capacitor 2307 (capacitance CAC) is coupled between IN and the gate of N2, and another resistor 2309 (resistance RAC) is coupled between the gate of N2 and a second switch 2311 which switches between voltage levels VHI2 and VLO in response to a second enable signal EN2.

For the unit amplifier 2300, the input signal is AC-coupled to the gates of the N1 and N2, in which N1 and N2 may be individually enabled or disabled based upon the position of the switches 2305 and 2311, respectively. The switches 2305 and 2311 adjust the DC bias voltage applied to the gates of N1 and N2, respectively, to put them in an active or cutoff region of operation. The unit amplifier 2300 is disabled when EN1 and EN2 both select VLO to put N1 and N2 in their respective cutoff regions. When EN1 selects VHI1 and EN2 selects VLO, N2 is in its cutoff region and disabled so that P1 and N1 are active based on the difference between voltage levels VDD2 and VDD1. When EN1 selects VLO and EN2 selects VHI2, N1 is in its cutoff region and disabled so that P1 and N2 are active based on voltage level VDD2.

Figure 11:
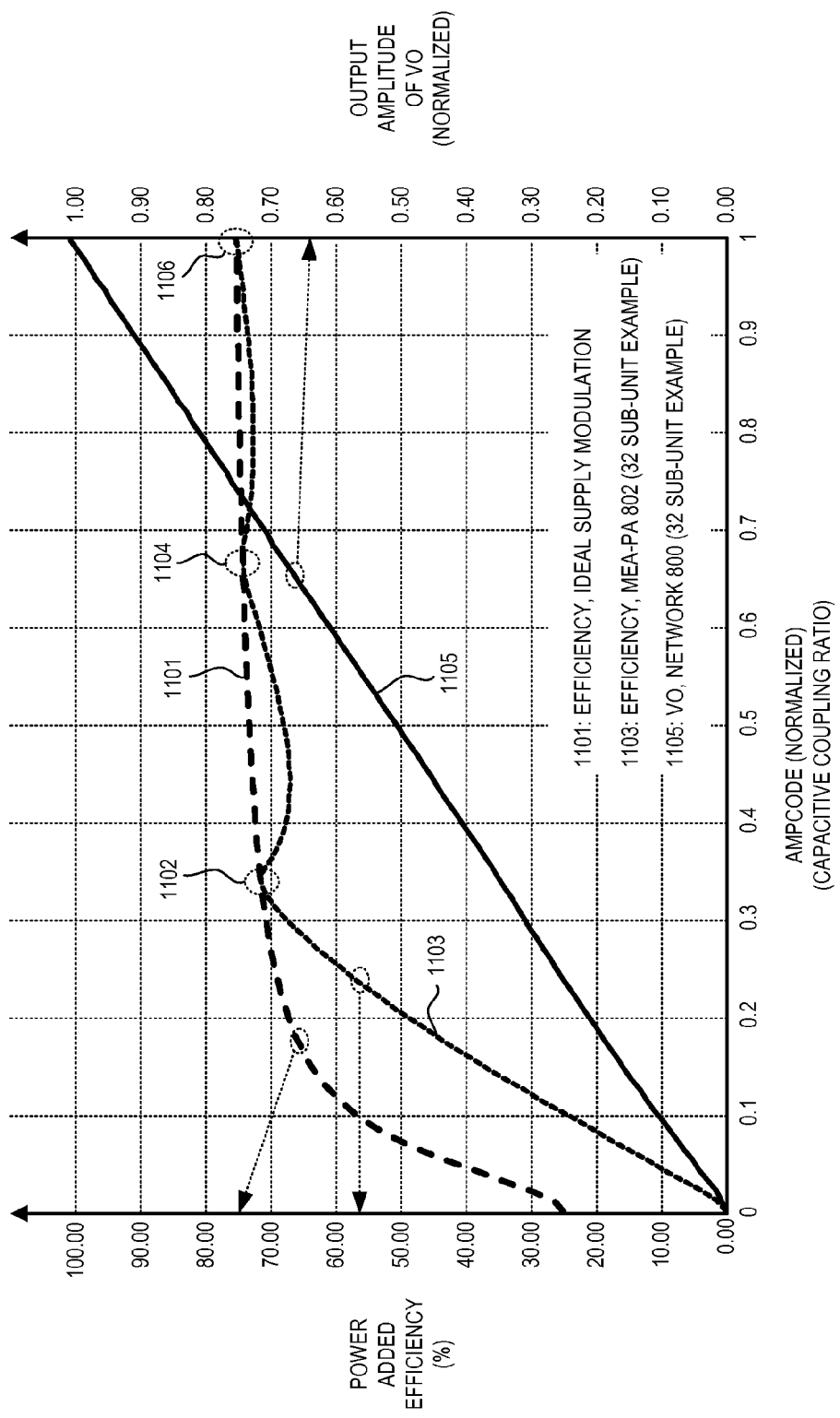
FIG. 11 is a graphic diagram plotting the efficiency and corresponding simulated normalized amplitude of the output voltage versus normalized amplitude code of the multi-element array power amplifier of FIG. 8.

FIG. 11 is a graphic diagram plotting the efficiency of the MEA-PA 802 (using intermediate supply voltages VDD1-VDD3 and using the unit amplifier 1000) with ideal supply modulation (dashed curve 1101, left-side vertical scale), the efficiency of the MEA-PA 802 (VDD1-VDD3, unit amplifier 1000) for k=32 sub-units and corresponding thermometer scheme as described further below (curve 1103, left-side vertical scale), and corresponding simulated normalized amplitude of the output VO of the amplitude control system 800 (VDD1-VDD3, unit amplifier 1000, k=32 sub-units) (curve 1105, right-side vertical scale), each versus normalized amplitude code.

A simple thermometer coding scheme was used for the simulation using 32 sub-units (32 unit amplifiers 801 and 32 capacitors) using 96 codes in which each sub-unit has one of the four states S0-S3. A first set of codes 0-31 is defined for the 32 states in which the switches 805 of the array of unit amplifiers 801 are switched from state S0 to state S1, a second set of codes 32-63 is defined for the 32 states in which the switches 805 of the array of unit amplifiers 801 are switched from state S1 to state S2, and a third set of codes 64-95 is defined for the 32 states in which the switches 805 of the array of unit amplifiers 801 are switched from state S2 to state S3.

Curve 1103 rises from 0% to about 70% for normalized AMPCODE 0 to about 0.33 representing increments of the code from 0 to 31, in which curve 1103 intersects the ideal curve 1101 at a point 1102 representing code 31. At code 31, all of the sub-units are powered with the same level of VDD1=⅓ VNOM. The curve 1103 also intersects the ideal curve 1101 at a second point 1104 for normalized AMPCODE of 0.66 corresponding to code 63. At code 63, all of the sub-units are powered with the same level of VDD2=⅔ VNOM. The curve 1103 also intersects the ideal curve 1101 at a third point 1106 for normalized AMPCODE of 1.0 corresponding to code 95. At code 95, all of the sub-units are powered with the same level of VDD3=VNOM.

In order maximize efficiency of the MEA-PA across amplitude, many intermediate supplies may be incorporated. Doing so, however, may increase circuit and coding complexity and add incremental overhead power consumption for each supply that is added. The optimal choice for number of supplies is determined by a tradeoff of efficiency and complexity, and may depend on the intended application of the PA array structure. Assuming an MEA-PA with k sub-units, wherein the i-th sub-unit has a coupling capacitance $C_i$, then the relative output amplitude is approximated according to the following equation (1):

$$\frac{VO}{VMAX} \approx \sum_{i=1}^{k} \frac{C_i}{C_T} \cdot \frac{VD_i}{VNOM}, \text{ such that } C_T = \sum_{i=1}^{k} C_i \qquad (1)$$

where $C_T$ is the total capacitance of the array of capacitors, and $VD_i$ is the voltage difference between the upper and lower supply terminals of the i-th sub-unit amplifier.

The MEA-PA 802 illustrates the use of 3 equally-spaced nonzero supply voltages between 0 and VNOM in order to simplify coding. The supply voltages, however, can be related in ways other than equal spacing in alternative embodiments. For instance, a given system may have common power supplies such as 3.3 Volts (V), 1.8V, 1.2V and 0V available and the MEA-PA may be adapted to use these unequally spaced supplies through use of proper amplitude encoding. In other words, the amplitude encoding is adjusted accordingly to obtain substantially the same results. Similarly, additional supply voltages may generated from a single core supply, such as using switching supply doublers, capacitive divide-by-2 circuits, etc. This may result in supply values of 0, (¼)·VNOM, (½)·VNOM, and VNOM. These supply values may also easily be used to generate a linear output response with a proper amplitude encoding scheme, based on equations (1) and/or (2).

Figure 25:
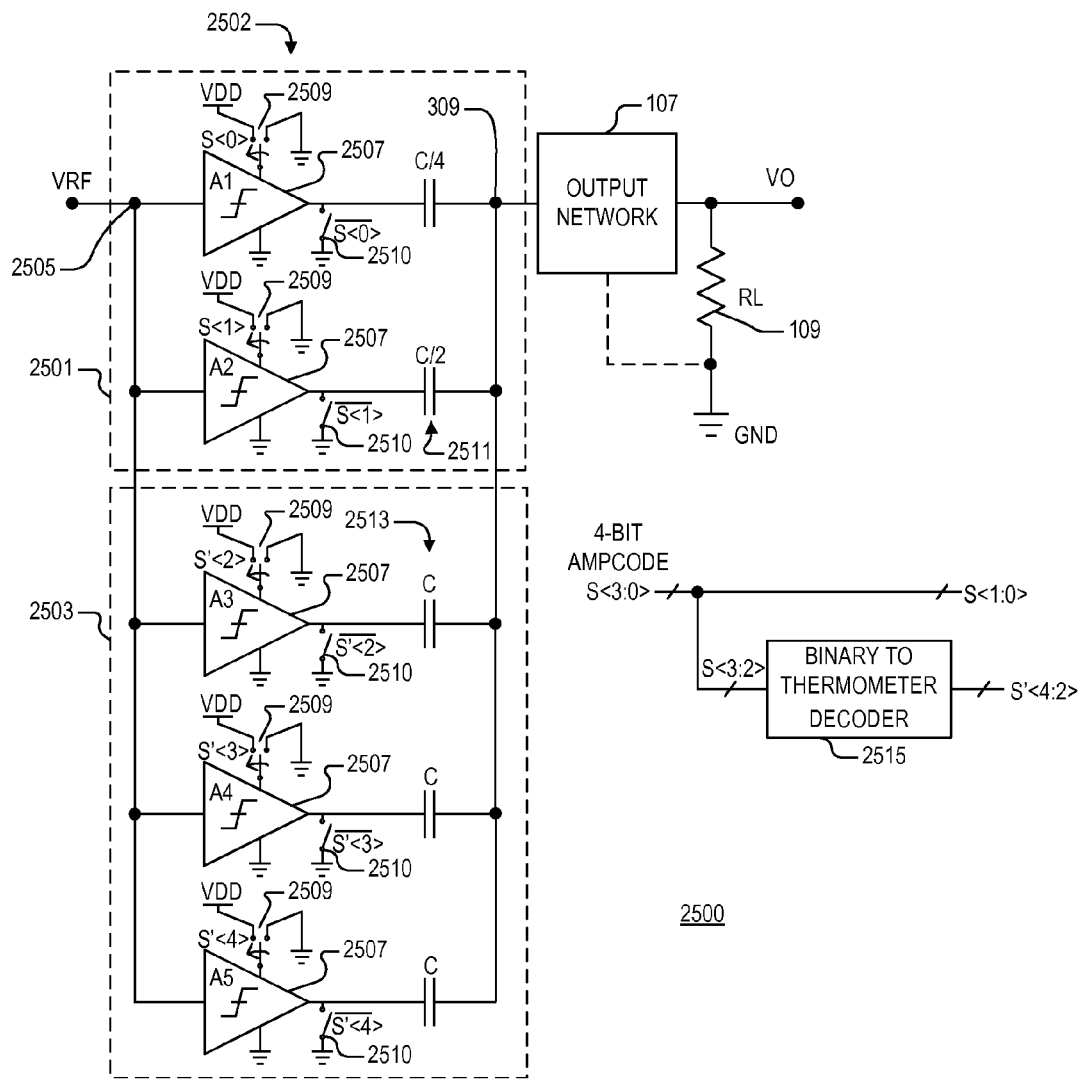
FIG. 25 is a schematic and block diagram of an amplitude control system implemented according to another embodiment including a segmented MEA-PA.

In some cases, it may be desirable to have very high precision control over output amplitude (i.e. many amplitude codes with reduced granularity). With a thermometer coding scheme, this may result in an impractically large number of elements in the array. To address this case, the MEA-PA may be split into two segments, a unit-element thermometer coded segment for the most-significant bits (MSBs), combined with a smaller binary-weighted array for the least significant bits (LSBs). A segmented MEA-PA 2500 is shown in FIG. 25.

The MEA-PA configurations described herein respond to changes in input amplitude code very quickly. This enables it to handle modulation schemes with very high bandwidth on the AM path. However, these sharp transitions may also introduce spurs in the output spectrum which are offset from the RF carrier frequency by the sample rate used in the AM path.

A number of methods may be employed to reduce the magnitude and/or spectral density of such spurs. First, increasing the precision of the MEA-PA (i.e. adding more codes) can reduce the spur magnitude by reducing quantization noise. Second, an additional bandpass filter may be incorporated into the output network of the MEA-PA to filter out the spurs. The bandpass filter method is more tractable when using very high sample rates on the AM path. Third, the spectral density of the amplitude spur may be dramatically reduced by using a spread spectrum sampling clock or a sample clock with a non-uniform sampling period. Fourth, the spurs may be substantially attenuated by loading the output node or other internal nodes within the MEA-PA with an active, or switching passive sampler designed to present a low impedance at or near the frequency of the amplitude spur. Lastly, switching transients may be smoothed with appropriate circuitry which employs gradual transitioning, otherwise referred to as "soft-switching" methods, which may reduce amplitude spur magnitude. Gradual transitioning means gradual activation and gradual deactivation of a switch. Other methods of spur reduction as known to those skilled in the art may be employed as well.

Figure 12:
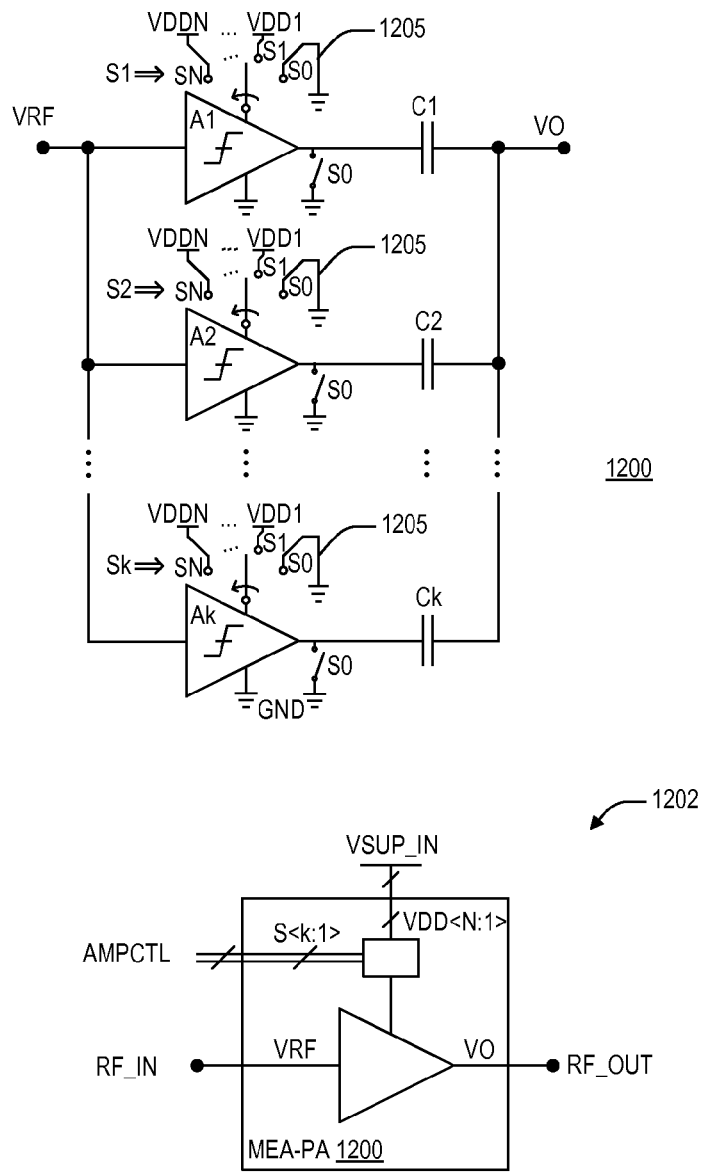
FIG. 12 is a schematic diagram of a multi-element array power amplifier for any number "N" of supply voltages.

FIG. 12 is a schematic diagram of an MEA-PA 1200 for a number "N" of supply voltages VDD1-VDDN and corresponding symbol shown at 1202. The number N is any suitable integer of 2 or more. The MEA-PA 1200 is substantially similar to the MEA-PA 802 except that the array of switches 805 are replaced with an array of switches 1205 with "N" states S0-SN for switching among the N different supply voltages VDD1-VDDN. The symbol 1202 shows an amplitude control input AMPCTL which includes the set of amplitude control signals S<k:1> (S0, S1, . . . , Sk), and further shows a single RF input signal RF_IN which is provided internally as the VRF input. The symbol 1202 further receives VSUP_IN voltage supply inputs which is provided internally as the set of N VDD supply voltages VDD<N:1> or VDD1, VDD2, . . . , VDDN. Although not explicitly shown by the symbol 1202, the supply voltages are relative to a reference or lower supply terminal of the PA, which is coupled to a reference node such as ground. The MEA-PA 1200 provides an output VO which is provided externally as an RF output signal RF_OUT.

In some applications, such as up-conversion mixers, multi-carrier or multi-standards communication systems, it may be desirable to efficiently combine RF signals having different phase and/or frequency into a single RF output. The MEA-PA structure described herein can accommodate such applications by virtue of its linear response to amplitude code, via capacitive coupling ratio and/or DC supply voltage variation, while offering significant advantages in terms of efficiency.

Figure 13:
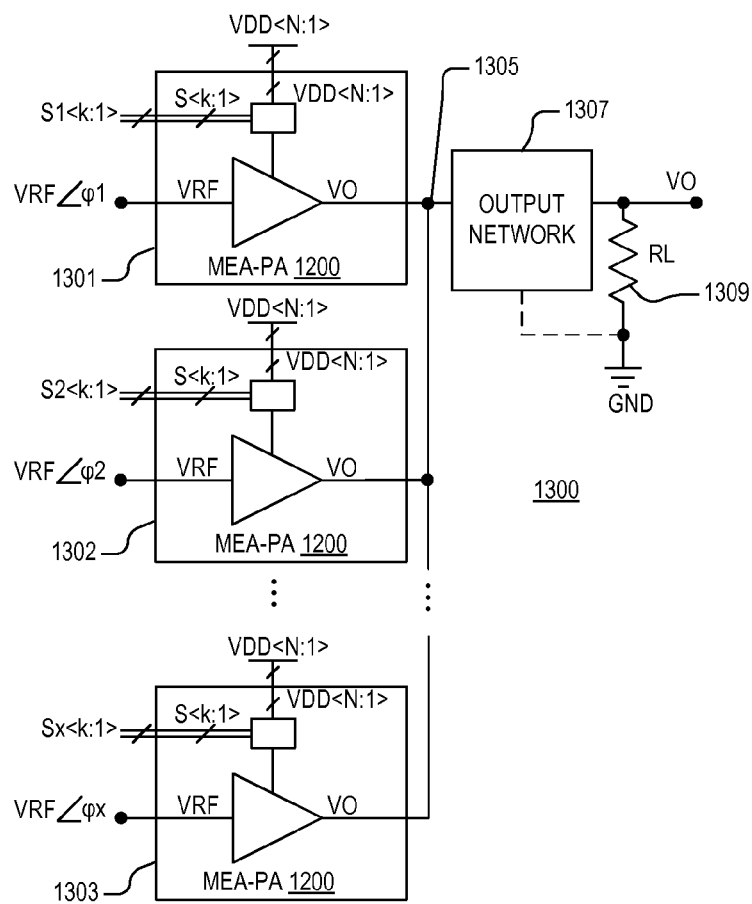
FIG. 13 is a schematic and block diagram of a multi-phase amplitude control system including an array of a number of the multi-element array power amplifiers of FIG. 12 which are used to combine RF signals with multiple phases.

FIG. 13 is a schematic and block diagram of a multi-phase amplitude control system 1300 including an array of a number "x" of the MEA-unit amplifiers 1200 which are used to combine RF signals with multiple phases. Each of the MEA-unit amplifiers 1200 receives a set of N supply voltages VDD<N:1>. A first MEA-PA 1301 receives a first set of amplitude control signals S1<k:1> and a first RF signal VRF with a first phase angle φ1, a second MEA-PA 1302 receives a second set of amplitude control signals S2<k:1> and a second RF signal VRF with a second phase angle φ2, and so on up to an xth MEA-PA 1303 receiving an xth set of amplitude control signals Sx<k:1> and an xth RF signal VRF with an xth phase angle φx. The outputs of the array of MEA-unit amplifiers 1200 are coupled together at a common node 1305, which is coupled to the input of an output network 1307. The output of the output network 1307 is coupled to an output node developing the output voltage VO across a load 1309 coupled between VO and ground.

The amplitude of each MEA-PA 1200 of the multi-phase amplitude control system 1300 is independently controlled by a corresponding one of the array of x amplitude control signals S1<k:1>-Sx<k:1> thus allowing the various RF inputs with different phases to be modulated independently and combined into a single output signal. Efficiently combining multiple RF signals having a common frequency but with multiple phases, as illustrated by the amplitude control system 1300, may be useful for applications like low-power phase-modulators or upconversion mixers used in transmitters.

In some applications, it may be desirable to combine the outputs of multiple instances of the MEA-PA structure in a variety of circuit networks, such as hybrid couplers, power combiners, and power dividers. Such networks may be employed in order to increase total output power, to isolate the inputs/outputs of various components sharing a connection to the network, or to provide a well-defined phase shift between the outputs of the multiple instances of the MEA-PA structure.

As is evident from previous simulation results shown in FIG. 11, the efficiency of the MEA-PA 802 begins to drop below the ideal curve 1101 as more and more sub-units are disconnected from the voltage supplies. FIG. 11 shows that this occurs particularly for amplitude codes below ⅓ of the full-scale value, because the lowest DC power supply available is ⅓ of the maximum supply value. Hence, for amplitude codes below ⅓, some sub-units are completely disabled reducing efficiency. In some applications, for cost or complexity reasons, it may be impractical to make multiple DC power supply voltages available to the MEA-PA, yet it remains desirable to achieve high efficiency at low amplitudes.

FIG. 14 is a schematic diagram of two functionally equivalent unit amplifiers 1401 and 1411 illustrating the stacking of individual amplifiers to emulate multiple non-zero voltage supply inputs. The amplifier 1401 (labeled A1) is configured in a substantially similar manner to each of the unit amplifiers 801, having its lower supply terminal coupled to ground, its upper supply terminal coupled to a switch 1403 with multiple states S0, S1 and S2, and its output coupled to another switch 1405. Input signal IN is provided to the input of amplifier 1401 and its output is coupled to one end of a unit capacitor 1407 (with capacitance C), having its other end providing output signal OUT. The switch 1403 switches between ground in state S0, VDD/2 in state S1, and VDD in state S2 as controlled by an enable signal EN. Switch 1405 is also controlled by EN such that it is closed in state S0 to ground the output of amplifier 1401, and otherwise opened. In this case, multiple non-zero power supply inputs VDD and VDD/2 are explicitly provided.

In operation of the unit amplifier 1401, in state S0 the amplifier 1401 is grounded and disabled, in state S1 the amplifier 1401 receives supply voltage VDD/2 and has its output provided to capacitance C of the capacitor 1407, and in state S1 the amplifier 1401 receives supply voltage VDD and has its output provided to capacitance C of the capacitor 1407.

Unit amplifier 1411 includes two amplifiers 1413 (A1a and A1b, instead of A1) each receiving IN. The upper supply terminal of the first amplifier A1a is coupled to supply voltage VDD and its lower supply terminal is coupled to a first switch 1415 for switching between open-circuit (state S0), an intermediate node 1416 (state S1), or ground (state S2). The upper supply terminal of the second amplifier A1b is coupled to a switch 1417 which switches between open-circuit (no connection for state S0), node 1416 (for state S1) or VDD (state S2). A decoupling capacitor 1418 (capacitance CAC) is coupled between intermediate node 1416 and ground. Two output switches 1419 are each coupled between an output of a corresponding one of the amplifiers A1*a* and A1*b* and ground, in which each switch 1419 is closed for state S0 and otherwise opened. The output of each amplifier A1*a* and A1*b* is coupled to one end of a corresponding one of a pair of capacitors 1421, each having a capacitance of C/2 (or half of the capacitance C of capacitor 1407) and each having its other end coupled to the output node providing the output signal OUT.

In operation of the unit amplifier 1411, in state S0 both amplifiers A1*a* and A1*b* are disabled having their outputs grounded by the switches 1419. The amplifier A1*a* is disabled in state S0 since its lower supply terminal is disconnected to a voltage level (open-circuited) so that it receives no supply current. In an alternative embodiment, state S0 of switch 1415 may be VDD for similar results. The amplifier A1*b* is also disabled in state S0 since its upper supply terminal is open-circuited so that the amplifier A1*b* is disconnected from a supply voltage. In state S1, both switches 1415 and 1417 select node 1416 so that the amplifiers A1*a* and A1*b* are stacked with supply voltages coupled in series between VDD and ground. In this case, node 1416 has a voltage of approximately VDD/2 (~VDD/2) so that both amplifiers A1*a* and A1*b* receive a supply voltage of ~VDD/2. Since each amplifier drives half the capacitance C/2 at its output, the unit amplifier 1411 is functionally equivalent to the unit amplifier 1401 in state S1. In state S2, the upper switch selects ground and the lower switch selects VDD, so that both amplifiers A1*a* and A1*b* receive a supply voltage of VDD. Since each amplifier drives half the capacitance C/2 at its output, the unit amplifier 1411 is functionally equivalent to the unit amplifier 1401 in state S2.

Essentially, for the unit amplifier 1411, the second state S1 is an additional switch state which is added to the upper supply node of A1*b* and the lower supply node of A1*a*, such that A1*a* and A1*b* are stacked in series with respect to VDD. Thus, the DC current from the power supply flows through the two sub-units A1*a* and A1*b* in series. The amplifiers A1*a* and A1*b* are biased such that the intermediate node 1416 settles to approximately VDD/2 (~VDD/2). The large decoupling capacitor CAC ensures that node 1416 is a low impedance (i.e., AC ground) for IN provided at an RF carrier frequency. Hence, each limiting amplifier produces approximately one-half of the max voltage swing. Though the two amplifiers A1*a* and A1*b* are in series with respect to DC current from the supply, their RF outputs add in parallel. The resulting output amplitude of the unit amplifier 1411 is ideally equivalent to the unit amplifier 1401 per equation (1). In general, the stacking approach may be extended to a larger number of sub-units. Further, more than two sub-units may be connected in series with respect to a given DC power supply.

The unit amplifier 1411 may use additional internal biasing inside A1*a* and A1*b* to ensure the intermediate node 1416 settles appropriately. For instance, if an inverter-based sub-unit limiting amplifier is used, similar to the unit amplifier 1000, then the DC bias voltage for the NMOS transistor within A1*a* is increased by approximately VDD/2. Despite the potential additional biasing circuitry, stacking of unit amplifiers enables improved efficiency at low output amplitudes without additional externally provided power supplies.

Figure 24:
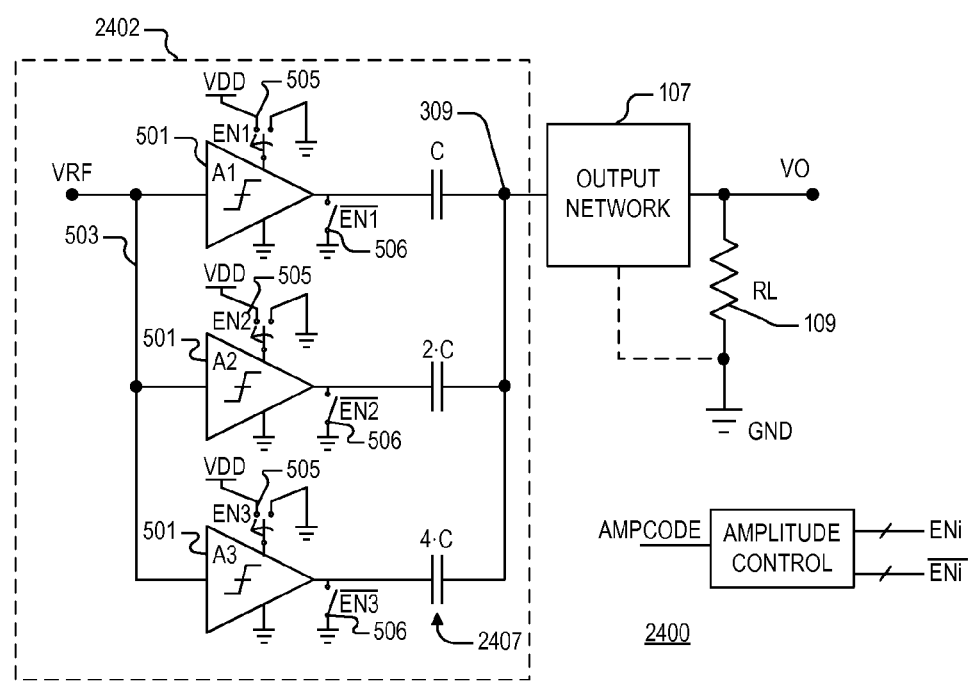
FIG. 24 is a schematic and block diagram of an amplitude control system implemented according to another embodiment including an MEA-PA which is a binary weighted version of the MEA-PA of FIG. 5.

FIG. 24 is a schematic and block diagram of an amplitude control system 2400 implemented according to another embodiment including an MEA-PA 2402 which is a binary weighted version of the MEA-PA 502. The amplitude control system 2400 is similar to the amplitude control system 500 in which similar devices and components assume identical reference numerals. The amplitude control system 2400 includes the output network 107 having an input coupled to node 309, and an output coupled to the load 109 (e.g., load resistor RL) and to an output node developing an output voltage VO. The MEA-PA 2402 is similar to the amplitude control system 2400 in which similar devices and components assume identical reference numerals. In this case, the MEA-PA 2402 includes an array of unit amplifiers 501 having inputs coupled to a common input node 503 receiving VRF, in which k=3 so that only three unit amplifiers 501 are included (individually labeled A1, A2 and A3). It is understood, however, that additional unit amplifiers 501 may be included in the unit amplifier array. The switches 505 and 506 are included and coupled in substantially similar manner, in which each switch 505 switches between ground and VDD as controlled by a corresponding one of enable signals EN1-EN3, and in which each switch 506 selectively grounds an output of a corresponding unit amplifier as controlled by inverted enable signals $\overline{EN1}$-$\overline{EN3}$.

The array of unit capacitors 307 is replaced by an array of binary-weighted capacitors 2407, each coupled between an output of a corresponding one of the unit amplifiers A1-A3 and the output node 309 of the MEA-PA 2402. Thus, unit amplifier A1 drives a capacitor with capacitance C, unit amplifier A2 drives a capacitor with twice the capacitance 2·C, and unit amplifier A3 drives a capacitor with four times the capacitance 4·C. For additional unit amplifiers, the capacitor array 2407 continues the binary-weighted relationship (e.g., 8·C, 16·C, 32·C, etc.) as understood by those of ordinary skill in the art.

Although not explicitly shown, the sizing of the constituent devices of each of the unit amplifiers A1-A3 may also be scaled in size in proportion to the capacitance they are driving.

FIG. 25 is a schematic and block diagram of an amplitude control system 2500 implemented according to another embodiment including a segmented MEA-PA 2502. The amplitude control system 2500 includes the output network 107 having an input coupled to node 309, and an output coupled to the load 109 (e.g., load resistor RL) and to an output node developing an output voltage VO. The MEA-PA 2502 includes an array of five unit amplifiers 2507 (A1-A5) each having an input coupled to common input node 2505, an upper supply terminal coupled to a corresponding one of an array of switches 2509 each switching between ground and VDD, a lower supply terminal coupled to ground, and an output coupled to a corresponding one of an array of switches switch 2510 for selectively grounding the output in a similar manner as previously described.

The MEA-PA 2502 is segmented into a binary-weighted coded MEA-PA 2501 and a thermometer coded MEA-PA 2503. The MEA-PA 2501 is similar to the binary-weighted MEA-PA 2402 with 2 unit amplifiers A1 and A2 having their outputs coupled to binary-weighted capacitors 2511 with capacitances C/4 and C/2, respectively. The MEA-PA 2503 includes 3 unit amplifiers A3-A5 and an array of unit capacitors 2513 each with the same capacitance C. Although not shown, the sizing of the constituent devices of each of the unit amplifiers A1-A5 may also be scaled in size in proportion to the capacitance they are driving.

The amplitude control system 2500 is controlled by a 4-bit AMPCODE S<3:0>. The least significant bits S<1:0> are used to control the switching of the amplifiers within the MEA-PA 2501. As shown, S<0> controls the switch 2509 of unit amplifier A1 and an inverted version of S<0>, or $\overline{S<0>}$, controls corresponding switch 2510. In a similar manner, S<1> and $\overline{S<1>}$ control the switches 2509 and 2510, respectively, of the unit amplifier A2. The amplitude control system 2500 further includes a binary to thermometer decoder 2515 which receives the most significant bits S<3:2> at its input and which provides 3 decoded bits S'<4:2> for controlling the switches of the amplifiers A3-A5. S'<2> and $\overline{S'<2>}$ control the switches 2509 and 2510, respectively, of the unit amplifier A3, S'<3> and $\overline{S'<3>}$ control the switches 2509 and 2510, respectively, of the unit amplifier A4, and S'<4> and $\overline{S'<4>}$ control the switches 2509 and 2510, respectively, of the unit amplifier A5.

Figure 26:
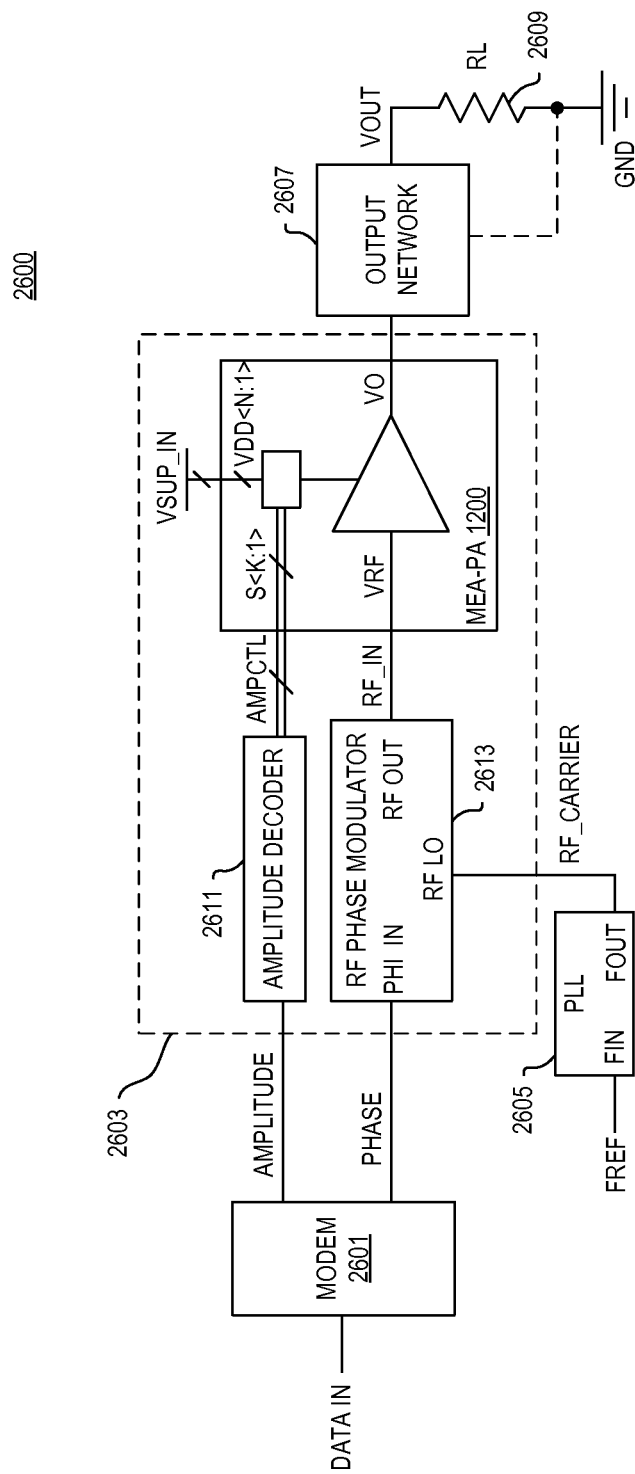
FIG. 26 is a block diagram of an RF transmitter system according to one embodiment employing the MEA-PA of FIG. 12.

FIG. 26 is a block diagram of an RF transmitter system 2600 according to one embodiment employing the MEA-PA 1200. The MEA-PA 1200 is used by the RF transmitter system 2600 to modulate the phase and amplitude of an RF carrier signal according to digital input data and to drive an output load for transmission through a medium. The output load (e.g., load 2609) may be an antenna, coax cable, or any other suitable RF port for transmission.

As shown, input digital data (DATA IN) is provided to an input of a modem 2601, which processes the data and provides an output signal formatted in a polar representation. In particular, the modem 2601 has an output providing an amplitude signal (AMPLITUDE) and a phase signal (PHASE), in which the amplitude and phase signals are varied according to a particular signal modulation scheme employed by the RF transmitter system 2603. The amplitude and phase signals are used to drive a polar transmitter sub-system 2603, which modulates the amplitude and phase of an input RF carrier signal (RF_CARRIER) in order to generate an RF output signal for transmission. In the illustrated embodiment, the RF carrier signal is generated by a phase-locked loop (PLL) block 2605, which receives a reference frequency signal FREF at its frequency input (FIN) and which provides the RF carrier signal at its frequency output (FOUT). The polar transmitter subsystem 2603 receives the amplitude and phase signals and the RF carrier signal, and it generates a modulated RF output signal VO suitable for transmission to an output load. VO is provided to an output network 2607 which provides an output VOUT across a load 2609 (e.g., represented by load resistance RL) in a similar manner previously described.

The AMPLITUDE signal is provided to an input of an amplitude decoder 2611, which provides an amplitude control signal AMPCTL to the control input of the MEA-PA 1200. The PHASE signal is provided to the phase input of an RF phase modulator 2613, which receives the RF_CARRIER signal at its RF local oscillator input (RF LO), and which provides an RF signal RF_IN at its RF output (RF OUT). RF_IN is provided to the RF input of the MEA-PA 1200.

An RF transmitter system utilizing an MEA-PA, such as the RF transmitter system 2600 using the MEA-PA 1200, may be advantageous for the reasons described herein. The efficiency improvement afforded by the MEA-PA may be of particular importance for a wide variety of wireless devices operating from small and/or rechargeable batteries, such as cellular phones, tablet computers, wireless sensor systems, wireless speakers and headphones, as well as many others. Any level of integration is possible and contemplated. In one embodiment, the MEA-PA 1200 is provided on a separate integrated circuit (IC) and controlled by a separate device. In another embodiment, the polar transmitter sub-system 2603 including the MEA-PA 1200 may be integrated on a single IC, or the entire RF transmitter system 2600 may be integrated on a separate IC depending upon the configuration.

An amplitude control system as described herein includes one or more multi-element array power amplifiers (MEA-PAs) to adjust amplitude of an input signal based on an amplitude control signal or the like. The amplitude control signal may be dynamically adjusted to adjust amplitude. Alternatively, the amplitude control signal may be a static value to implement a static gain setting. Amplitude is adjusted by adjusting a capacitive coupling ratio through enabling/disabling amplifiers and/or by controlling source voltage applied to one or more of the amplifiers.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. An amplitude control system, comprising:
   at least one input node and an output node; and
   at least one multi-element array power amplifier, each comprising:
   a plurality of amplifiers, each having an input coupled to said at least one input node and each having an output coupled to a corresponding one of a plurality of intermediate nodes;
   a plurality of capacitors, each said capacitor having a first end coupled to said output node and having a second end coupled to a corresponding one of said plurality of intermediate nodes; and
   a plurality of enable circuits collectively controlled by an amplitude control value, wherein each of said plurality of enable circuits is operative to enable or disable a corresponding one of said plurality of amplifiers.

2. The amplitude control system of claim 1, further comprising a filter coupled to said output node, wherein said filter improves a spectral profile of an output signal provided on said output node.

3. The amplitude control system of claim 1, further comprising a coupling circuit which couples an intermediate node to a reference node when a corresponding one of said plurality of amplifiers is disabled.

4. The amplitude control system of claim 1, wherein at least one of said plurality of amplifiers comprises a limiting amplifier.

5. The amplitude control system of claim 1, wherein each of said plurality of capacitors has a common capacitance.

6. The amplitude control system of claim 1, wherein said plurality of capacitors form a binary-weighted array of capacitances.

7. The amplitude control system of claim 1, wherein said plurality of capacitors and said plurality of amplifiers are segmented into sub-groups including at least one binary weighted sub-group and at least one sub-group using thermometer coding.

8. The multi amplitude control system of claim 1, wherein each of said plurality of enable circuits is operative to enable a corresponding one of said plurality of amplifiers by providing a conduction path to one of a plurality of supply voltages.

9. The amplitude control system of claim 8, wherein said plurality of enable circuits are dynamically controlled to modulate amplitude of a signal on said output node.

10. The amplitude control system of claim 8, wherein said plurality of supply voltage levels comprises a predetermined nominal voltage level and a reference voltage level of said reference node.

11. The amplitude control system of claim 10, wherein said plurality of supply voltage levels further comprises at least one intermediate voltage level between said nominal voltage level and said reference voltage level.

12. The amplitude control system of claim 10, wherein said plurality of supply voltage levels further comprises a plurality of intermediate voltage levels equally distributed between said nominal voltage level and said reference voltage level.

13. The amplitude control system of claim 8, wherein at least two of said plurality of amplifiers are stacked in which a lower supply terminal of a first amplifier is coupled to an upper supply terminal of a second amplifier.

14. The amplitude control system of claim 1, wherein said plurality of enable circuits comprise switching circuits controlled by a spread spectrum sampling clock.

15. The amplitude control system of claim 1, wherein said plurality of enable circuits comprise switching circuits controlled by a sample clock with a non-uniform sampling period.

16. The amplitude control system of claim 1, wherein said plurality of enable circuits comprise switching circuits in which switching transients are smoothed using gradual transitioning.

17. The amplitude control system of claim 1, wherein said at least one input node comprises a plurality of input nodes, wherein said at least one multi-element array power amplifier comprises a plurality of multi-element array power amplifiers, and wherein each of said plurality of multi-element array power amplifiers comprises a plurality of amplifiers each having an input coupled to a corresponding one of said plurality of input nodes.

18. The amplitude control system of claim 17, wherein each of said plurality of multi-element array power amplifiers comprises a plurality of enable circuits collectively controlled by a corresponding one of a plurality of amplitude control values for independently controlling the amplitudes of a plurality of input signals provided to said plurality of input nodes.

19. An RF transmission system, comprising:
   an amplitude converter which provides an amplitude control value;
   an RF modulator which provides an RF signal on an input node; and
   a multi-element array power amplifier, comprising:
      a plurality of amplifiers, each having an input coupled to said input node and each having an output coupled to a corresponding one of a plurality of intermediate nodes;
      a plurality of capacitors, each said capacitor having a first end coupled to an output node and having a second end coupled to a corresponding one of said plurality of intermediate nodes; and
      a plurality of enable circuits collectively controlled by said amplitude control value, wherein each of said plurality of enable circuits is operative to enable or disable a corresponding one of said plurality of amplifiers.

20. The RF transmission system of claim 19, further comprising:
   a modem which receives a digital data input and which provides an amplitude signal and a phase signal;
   wherein said amplitude converter comprises an amplitude decoder which converts said amplitude signal to said amplitude control value; and
   wherein said RF modulator comprises an RF phase modulator which receives said phase signal and an RF carrier and which provides said RF signal.

* * * * *